United States Patent [19]
Gandhi et al.

[11] Patent Number: 6,112,218
[45] Date of Patent: Aug. 29, 2000

[54] DIGITAL FILTER WITH EFFICIENT QUANTIZATION CIRCUITRY

[75] Inventors: Prashant Gandhi, Sunnyvale, Calif.; James R. Hochschild, Plano, Tex.

[73] Assignee: Texas Instruments Incorporated, Dallas, Tex.

[21] Appl. No.: 09/050,391

[22] Filed: Mar. 30, 1998

[51] Int. Cl.$^7$ .................................................. G06F 17/10
[52] U.S. Cl. ............................................................ 708/320
[58] Field of Search .................................. 708/320, 300, 708/306, 603

[56] References Cited

U.S. PATENT DOCUMENTS

| | | | |
|---|---|---|---|
| 3,892,953 | 7/1975 | Nussbaumer | 708/603 |
| 5,629,881 | 5/1997 | Leeb et al. | 708/320 |
| 5,798,954 | 8/1998 | Ishibata | 708/320 |
| 5,944,775 | 8/1999 | Satoshi | 708/603 |

OTHER PUBLICATIONS

"A Computer–Aided Test for the Absence of Limit Cycle in Fixed–Point Digital Filters," Bauer, et al., *IEEE Transactions On Signal Processing*, vol. 39, No. 11, Nov. 1991, pp. 2400–2410.

"Chapter 7: *Robust Digital Filter Structures*," P. P. Vaidyanathan, Mitra and Kaiser, *Handbook for Digital Signal Processing* (Wiley & Sons,1993), pp. 419–490.

*Primary Examiner*—Tan V. Mai
*Attorney, Agent, or Firm*—Tammy L. Williams; Wade James Brady, III; Frederick J. Telecky, Jr.

[57] ABSTRACT

An infinite impulse response (IIR) digital filter and method of performing the same is disclosed. The digital filter may be realized by way of a programmable logic device, such as a digital signal processor (75), or alternatively by way of dedicated logic including adders (44, 48, 50, 54, 58, 62, 66, 70, 72) and shifters (46, 52, 56, 60, 64). In either case, addition operations (34) are interleaved among first and second output sample values ($y_{n-1}$, $y_{n-2}$), so that the resulting addition (30; 72; 215; 320) may be carried out with adder circuitry of the same precision as the signal input ($x_n$) and signal output ($y_n$). Carry control circuitry (76, 78, 80, 82, 84, 88; 217; 317) is provided to efficiently incorporate magnitude truncation quantization.

19 Claims, 6 Drawing Sheets

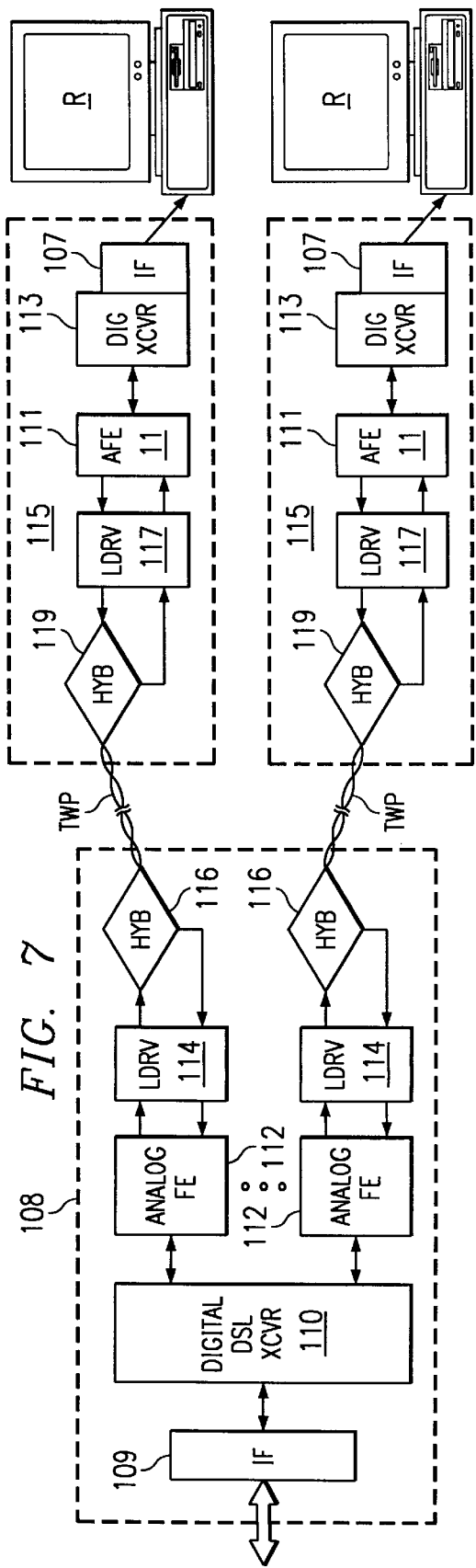
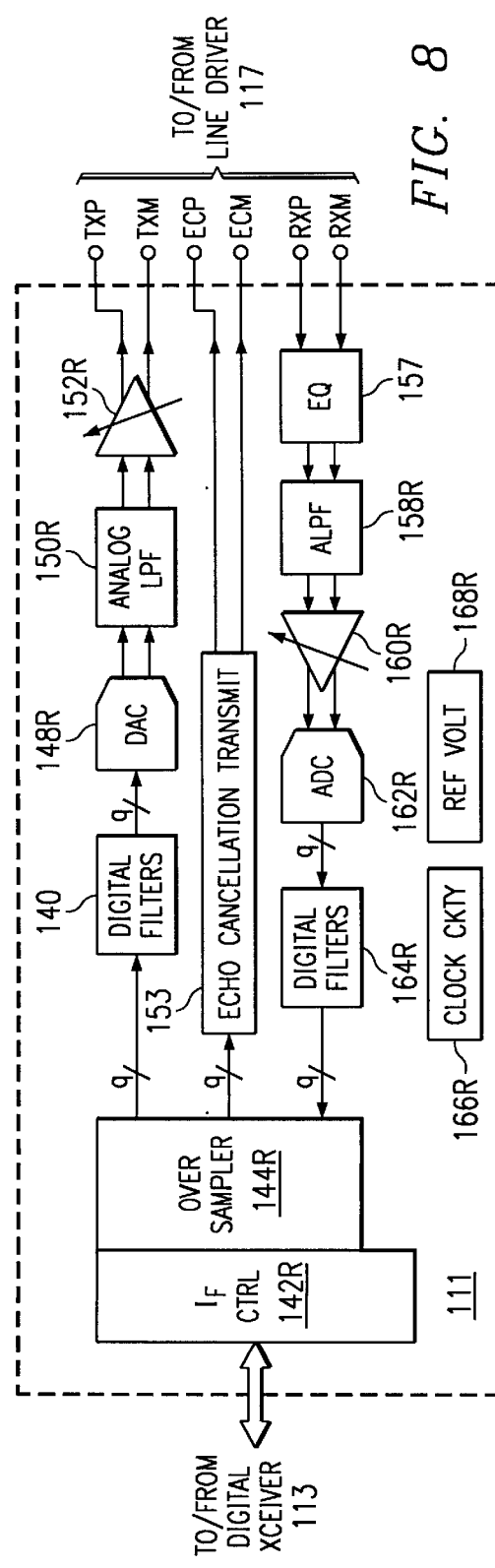

DIGITAL FILTER WITH EFFICIENT QUANTIZATION CIRCUITRY

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of digital filters, and is more specifically directed to quantization techniques, particularly in infinite impulse response (IIR) digital filters.

As is well known in the art, digital signal processing is now commonly used in many electronic systems, over a wide range of applications. Digital signal processing techniques are now particularly commonplace in telecommunication applications such as wireless telephones, data communications by way of modems and the like, and other facets of this field. Digital signal processing is also utilized in video and audio signal processing, such as used in image recognition, image processing, data compression, digital audio and digital video recording and playback, and the like.

A fundamental building block in the field of digital signal processing is the digital filter. As. is elementary in this field, digital filters refer to the filtering of sampled-data, or discrete-time, signals, which are typically digital representations of analog signals which have been generated by way of analog-to-digital conversion. Fundamentally, a digital filter is a computational process, carried out either through dedicated hardware or through the execution of a sequence of instructions by programmable logic, by way of which an input sequence of numbers is converted into an output sequence of numbers, modified by a transfer function. Typical transfer functions refer to the frequency characteristics of the filter; analogously to analog filter counterparts, examples of digital filter transfer functions include low-pass, high-pass, band-pass, etc. Digital filter computations typically include digital addition, digital multiplication of signal values by constants, and the insertion of delay stages.

As is also well known in the art, digital filters are often classified according to their impulse response. Finite impulse response (FIR) digital filters refer to the class of filters in which only a finite number of input samples affect the generation of a given output sample; typically, FIR digital filters perform computations upon a finite number of input samples (i.e., the current sample, and a selected number of preceding input samples), in a non-recursive fashion. Infinite impulse response (IIR) digital filters are a class of filters in which previous output samples are also used in generating a current output sample, and are thus typically realized in a recursive fashion, including feedback of output sample values. Because of the feedback of prior output values, each current output value of an IIR filter depends upon the value of an infinite series of input sample values, hence the term "infinite impulse response".

As noted above, digital filter realizations generally include multiplication operations, specifically the multiplication of a sampled-data value by a constant value (i.e., a coefficient). According to conventional implementation, a binary multiply of an p-bit digital word by an q-bit digital word will result in a product that occupies p+q-bits. Typically, digital filters operate upon input and output sample values of the same resolution, expressed by the same number of bits in the digital words representing these values. Accordingly, the higher precision data words resulting from the multiply operation are typically truncated, or quantized, to the lower-order of the output sample value. Various types of quantization are known in the art, including simple truncation of lower-order bits, rounding, and magnitude truncation (as will be described in further detail below). In the above example, if p-bits are used to represent the input and output sample values, and if q-bit coefficients are utilized, the p+q-bit multiplication results will be quantized to an p-bit data word.

Quantization necessarily inserts error into the digital filter process, as the resulting quantized value is of less precision that the pre-quantization product. The resulting quantization error is of particular concern in the feedback paths of IIR filters, as will now be described relative to FIGS. 1a and 1b. FIG. 1a illustrates the recursive (feedback) portion of a simple first-order IIR filter 2, realized by adder 3, delay stage 4, and multiplier 5. Adder 3 receives the current input value $x_n$ and the output of multiplier 5 at its inputs, and generates output value $y_n$ at its output. Output value $y_n$ is also applied to delay stage 4, for use in connection with the next sample. The output of delay stage 4 corresponds to output value $y_{n-1}$, since delay stage 4 incorporates a delay of one sample period. The output of delay stage 4 is multiplied by coefficient value a, in multiplier 5, and the product applied to adder 3 as noted above. This operation of filter 2 may therefore be defined as:

$$y_n = x_n + a \cdot y_{n-1}$$

where the nth output sample $y_n$ corresponds to the sum of the current input sample $x_n$ with the product of the value of coefficient a times the prior output sample $y_{n-1}$. This simple first order filter thus has the z-domain transfer function H(z):

$$H(z) = \frac{1}{1 - az^{-1}}$$

where $z^{-1}$ is the z-domain delay operator. Filter 2 of FIG. 1a thus has a single pole, at z=a, requiring coefficient a to have an absolute value less than or equal to unity for stability.

As noted above, however, for an p-bit input value x (and output value y), and assuming an q-bit coefficient a, the output of multiplier 5 will be an p+q-bit value. As such, some degree (specifically, q-bits) of quantization is necessary to generate the p-bit output sample value y. FIG. 1b illustrates digital filter 2', which is constructed similarly as filter 2 in FIG. 1a, but which also includes quantizer 6 disposed at the output of multiplier 5, prior to adder 3. As shown in FIG. 1b, multiplier 5 generates an p+q-bit product output that is quantized by quantizer 6 into an p-bit digital word prior to application to adder 3. Filter 2' thus generates an p-bit output value $y_n$ for each input sample value $x_n$. The operation of filter 2' of FIG. 1b can thus be expressed as:

$$y_n = x_n + Q[a \, y_{n-1}]$$

where Q refers to the quantization operation of quantizer 6.

A well-known problem in IIR digital filters is referred to as "limit cycles". The limit cycle problem is manifest in digital filters that generate an oscillating output signal in response to a constant or zero-level input. In this regard, FIGS. 1a and 1b include only the recursive portions of filters 2, 2', because limit cycles are caused only by the recursive feedback loops, as is known in the art. It will be understood that the non-recursive (feed-forward) portion of the filters will be implemented in cascade with the recursive portions shown in FIGS. 1a, 1b. Referring to FIG. 1b, an example of the generation of limit cycles responsive to a zero-level input will now be described, in the case where $x_n=0$ for all n, where $a=-\frac{1}{2}$, and where $y_{-1}=7$. As noted above, filter 2' of FIG. 1b realizes the expression of $y_n=x_n+Q[a \cdot y_{n-1}]$. In this example, assume that the quantization function Q is a simple rounding function $Q_R$. As a result, and considering that $x_n=0$ for all n, filter 2' thus may be expressed as:

$$y_n = Q_R\left[-\frac{1}{2}y_{n-1}\right]$$

Beginning with sample n=−1, one may thus tabulate the values of $y_n$ as follows:

$y_{-1}=7$ $y_0=Q_R[-\frac{1}{2}(7)]=Q_R[-3.5]=-4$ $y_1=Q_R[-\frac{1}{2}(-4)]=Q_R[2.0]=+2$ $y_2=Q_R[-\frac{1}{2}(2)]=Q_R[-1.0]=-1$ $y_3=Q_R[-\frac{1}{2}(-1)]=Q_R[0.5]=+1$ $y_4=Q_R[-\frac{1}{2}(+1)]=Q_R[-0.5]=-1$ $y_5=Q_R[-\frac{1}{2}(-1)]=Q_R[0.5]=+1$ The −1, +1 sequence for output sample values y beyond $y_5$ will continue to repeat so long as the zero-level input is applied.

As is evident from the foregoing, oscillation at the output $y_n$ is due to the recursive state signal $y_{n-1}$ being initially at a non-zero value, and energized over time by round-off quantizer 6. In effect, round-off quantizer 6 increases the amplitude of the recursive state variable $y_n$ in some instances, keeping this input to filter 2' from decaying to zero, even with input sample values $x_n$ being zero. This limit cycle oscillation at output $y_n$ increases the noise floor of the digital filter, reducing the signal-to-noise ratio of the system. In addition, if the output of the digital filter is applied to downstream digital filter stages, the oscillation error can be unintentionally amplified, exacerbating the error.

Other quantization approaches known in the art address the limit cycle problem. For example, the magnitude truncation quantization approach is defined as:

$|Q_{MT}(x)| \leq |x|$, for all $x$

Mitra and Kaiser, *Handbook for Digital Signal Processing* (Wiley, 1993), chapter 7. Magnitude truncation effectively rounds off toward zero. For example, in this approach, $Q_{MT}(+3.5)=+3$, and $Q_{MT}(-3.5)=-3$. As a result, recursive state variables such as $y_{n-1}$ in filter 2', will decay to zero with zero-level input values $x_n$.

By way of extension, second-order IIR digital filters generally also include quantization processes in the recursive, feedback loops. An exemplary simple transfer function, for the recursive portion of the filter only, may be expressed in the z-domain as follows:

$$H(z) = \frac{1}{1-a_1z^{-1}-a_2z^{-2}}$$

In this filter, the coefficients $a_1$ and $a_2$ must have absolute values less than 2 and 1, respectively, for purposes of stability (i.e., to avoid the poles of the filter). A non-recursive portion of the filter may, of course, be incorporated into the numerator of this transfer function H(z).

In any event, quantization will be typically utilized in typical digital realizations, as will now be described relative to FIGS. 2a and 2b, which illustrate alternative approaches in implementing quantization into second-order IIR digital filters.

In FIG. 2a, filter 8 includes adders 10 and 20. Adder 10 receives the current input sample value $x_n$ and the output of adder 20 at its inputs, and generates current output sample value $y_n$ at its output. Output sample value $y_n$ is fedback into filter 8 by way of delay stages 11, 13, each of which encompass a delay defined by the sample period of filter 8; the output of delay stage 11 is applied to the input of delay stage 13, as shown. Sample $y_{n-1}$ at the output of delay stage 11 is applied to multiplier 12, and is multiplied by coefficient $a_1$ thereby; similarly, sample $y_{n-2}$ at the output of delay stage 13 (and which thus has been delayed by two sample periods) is applied to multiplier 14, which multiplies sample $y_{n-2}$ by coefficient $a_2$.

As noted above, the output of multipliers 12, 14 are p+q-bit digital words, in the case where input and output samples x, y are p-bit words and where coefficients $a_1$, $a_2$ are q-bit words. In filter 8 of FIG. 2a, two quantizers 16, 18 are utilized at the outputs of multipliers 12,14, respectively, and their outputs (p-bits wide) are added by adder 20, the output of which is applied to adder 10. The operation realized by second-order IIR digital filter 8 may be expressed as:

$y_n=x_n+Q[a_1y_{n-1}]+Q[a_2y_{n-2}]$

This expression reflects the two quantizers 16, 18.

In FIG. 2b, filter 8' includes a single quantizer 24 is inserted between adder 22 and adder 10. The filter expression of filter 8' is as follows:

$y_n=x_n+Q[a_1y_{n-1}+a_2y_{n-2}]$

As described in Bauer and Leclerc, "Computer-Aided Test for the Absence of Limit Cycles in Fixed-Point Digital Filters", *Transactions on Signal Processing* (IEEE, Nov. 1991), pp. 2400–2410, the stability region within which coefficients $a_1$, $a_2$ may reside is greater for filter 8' than for filter 8. Specifically, coefficient $a_1$ may not have an absolute value greater than 1 for any value of coefficient $a_2$ in filter 8, while in filter 8' coefficient $a_1$ may have an absolute value greater than 1 for some negative values of coefficient $a_2$ (particularly as coefficient $a_2$ becomes more negative, up to its limit of −1). Accordingly, filter 8' is often preferred, as a wider range of filter characteristics are available.

However, adder 22 receives the full precision results of multipliers 12, 14, and as such is realized as an p+q-bit adder according to conventional techniques. FIG. 3 illustrates the operation of multipliers 12, 14 and adder 22 in this example. As illustrated in FIG. 3, multiplier 12 is realized as a series of successive shift and add operations applied to output sample value $y_{n-1}$ from delay stage 11, in the manner defined by the non-zero bits of coefficient $a_1$, with the final sum $a_1y_{n-1}$ being expressed as p+q-bits. Multiplier 14 is similarly arranged, and multiplies output sample value $y_{n-2}$ by coefficient $a_2$. Adder 22 adds the two results from multipliers 12, 14, to derive the p+q-bit value $a_1y_{n-1}+a_2y_{n-2}$.

While improved quantization is provided by the use of single quantizer 24 of filter 8', in combination with the wider range of coefficients $a_1$, $a_2$ under which stability is still maintained, the higher precision implementation of adder 22 occupies a significantly greater amount of chip area, particularly if filter 8' is replicated many times in an integrated circuit, for example in realizing higher order filters by the cascading of first and second order filters. Additionally, while quantization error is improved by high precision adder 22 in filter 8', a certain amount of noise is generated by adder 22 itself in a manner which depends upon the number of bits of precision.

BRIEF SUMMARY OF THE INVENTION

It is therefore an object of the present invention to provide a digital filter having a recursive path in which reduced precision adder circuitry can be utilized without increasing quantization error.

It is a further object of the present invention to provide such a digital filter which may be efficiently implemented in an integrated circuit, relative to chip area.

It is a further object of the present invention to provide such a digital filter which may be efficiently implemented relative to memory resource requirements. RIt is a further object of the present invention to provide such a digital filter which may be implemented as a dedicated, fixed-coefficient, digital filter.

It is a further object of the present invention to provide such a digital filter which may be implemented as a programmable coefficient digital filter, such as may be performed by a microcoded digital signal processor (DSP).

Other objects and advantages of the present invention will be apparent to those of ordinary skill in the art having reference to the following specification together with its drawings.

The present invention may be implemented into a digital filter by providing an adder function in which the addends are multiplied by filter coefficients and added in an interleaved manner, for second-order digital IIR filters. Specifically, the addition and multiply operations are carried out by way of add and shifts for each non-zero bit position in the coefficient for each of the delayed output samples, in increasing order of the non-zero bit positions. The adder circuitry need only have the same precision as the output signal; least significant bits of the sums are retained in an ORed manner, for generating a carry signal at the end of the summation in order to effect magnitude truncation quantization.

BRIEF DESCRIPTION OF THE SEVERAL VIEWS OF THE DRAWING

FIG. 7 is an electrical diagram, in block form, of a digital subscriber line system utilizing the digital filter of FIG. 6 according to the first preferred embodiment of the invention.

FIG. 8 is an electrical diagram, in block form, of an analog front end function in a remote modem in the system of FIG. 7 and utilizing the digital filter of FIG. 6 according to the first preferred embodiment of the invention.

DETAILED DESCRIPTION OF THE INVENTION

As will be described in further detail hereinbelow, the preferred embodiment of the present invention may be implemented into digital filters of any type and application. However, as will become apparent from the following description, the present invention is especially beneficial when applied to the recursive loops in infinite impulse response (IIR) digital filters, particularly in providing an efficient quantization technique for inhibiting limit cycles. The present invention may also be used in connection with the non-recursive (i.e., feed-forward) loops in IIR filters (particularly if similar functionality is used for the recursive loops) and in finite impulse response (FIR) filters; however, the same degree of benefit may not be realized in these uses as in the feedback loops in IIR filters.

In addition, it will become apparent from the following description that various quantization approaches may be used in connection with the present invention. It is contemplated, however, that magnitude truncation quantization is the preferred quantization approach used in the preferred embodiment of the invention. In particular, implementation of magnitude truncation quantization through use of a two's complement quantization approach is particularly efficient when realized in the preferred embodiment of the present invention, as will now be described.

As noted above, magnitude truncation quantization has the benefit of rounding digital values toward zero in all cases, and thus avoiding "rounding-up" of values which can cause limit cycle behavior. According to two's complement truncation, fractional parts of each two's complement binary value are simply discarded; in this scheme, all numbers are rounded to zero, except for negative numbers having fractional portions which are rounded toward negative infinity. By way of example, the following table illustrates a two's complement quantization function $Q_{TC}$ and magnitude truncation quantization function $Q_{MT}$ for a number x which is represented as an integer portion I and a fractional portion F:

| x | $Q_{TC}(x)$ | $Q_{MT}(x)$ |
|---|---|---|
| +I.0 (i.e., F=0) | +I | +I |
| −I.0 | −I | −I |
| +I.F | +I | +I |
| −I.F | −I | −I−1 |

Accordingly, one may derive a relationship for magnitude truncation quantization function $Q_{MT}$ based upon two's complement quantization function $Q_{TC}$ as follows:

$$Q_{MT}(x) = \begin{cases} Q_{TC}(x), & \text{for } F = 0 \text{ or } x \geq 0 \\ Q_{TC}(x) + 1, & \text{for } F \neq 0 \text{ and } x < 0 \end{cases}$$

Figure 4:
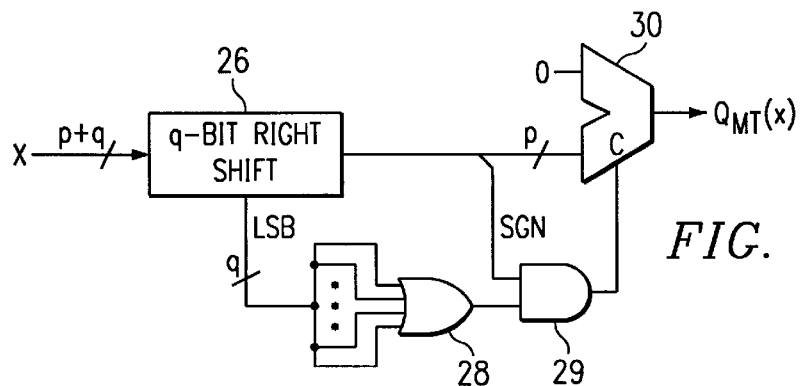
FIG. 4 is an electrical diagram, in block form, of circuitry for performing magnitude truncation quantization by way of two's complement quantization, according to the preferred embodiment of the invention.

According to the preferred embodiment of the invention, therefore, the implementation of the magnitude truncation quantization function $Q_{MT}$ may be accomplished by a single add/shift, with two logic functions, as illustrated in FIG. 4, which will now be described in detail.

FIG. 4 illustrates magnitude truncation quantization function $Q_{MT}$ of an p+q-bit value x by way of a two's complement quantization operation. As shown in FIG. 4, p+q-bit value x is presented in two's complement fashion. Value x is applied to an q-bit right shift process 26, in which the n least significant bits are applied, on bus LSB, to n-input OR gate 28. The remaining p-bits (i.e., the m most significant bits of value x) are applied to one input of adder 30, the other input of which receives a fixed zero value. The most significant bit of value x (which, in two's complement form, indicates a negative number when 1 and a non-negative number when 0) is applied on line SGN to one input of AND gate 29. AND gate 29 receives the output of OR gate 28 at its other input, and applies its output to the carry-in input of adder 30. Adder 30 generates an p-bit output which corresponds to the result of the magnitude truncation function $Q_{MT}$ applied to input value x.

In operation, the logical OR of the n least significant bits of input value x corresponds to a determination if the fractional part of input value x (i.e., the portion F) is equal to zero. If any bit of these n LSBs is not zero, the output of OR gate 28 is driven high. AND gate 29 generates a carry signal to adder 30 in response to the fractional part of input value x being non-zero and input value x being negative (as indicated by a 1 value on line SGN). Shift function 26 effectively divides input value x by $2^n$, maintaining the two's complement format. Adder 30 then simply adds the carry-in value from AND gate 29 to the p-bit representation $x/2^n$ from shift function 26, producing the output magnitude truncation quantized value $Q_{MT}(x)$ shown in FIG. 4.

The performing of magnitude truncation quantization by using a single add/shift, with simple logic for generating the carry-in to the add function, as shown in FIG. 4, is used to advantage in carrying out the present invention.

Figure 1A:
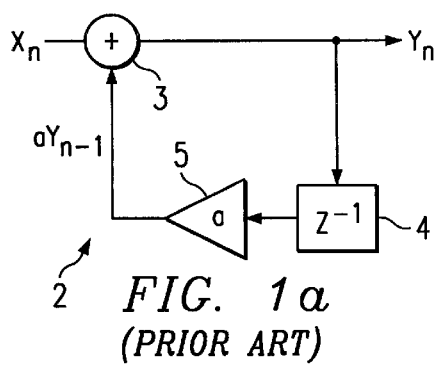
FIGS. 1a and 1b are electrical diagrams, in block form, of conventional first-order digital filters.
Figure 1B:
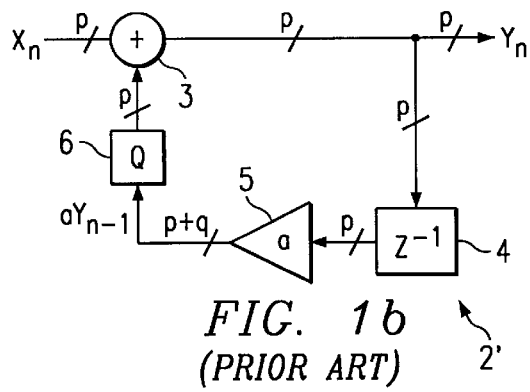
Figure 2A:
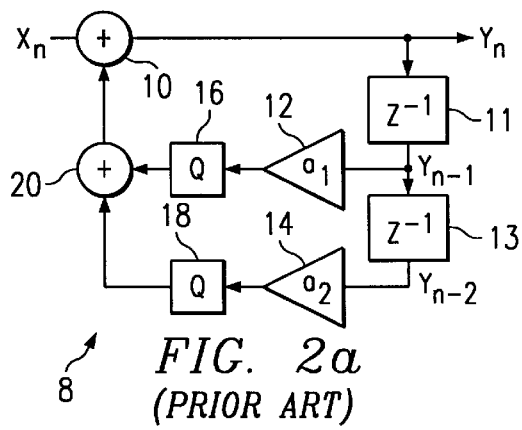
FIGS. 2a and 2b are electrical diagrams, in block form, of conventional second-order digital filters.
Figure 2B:
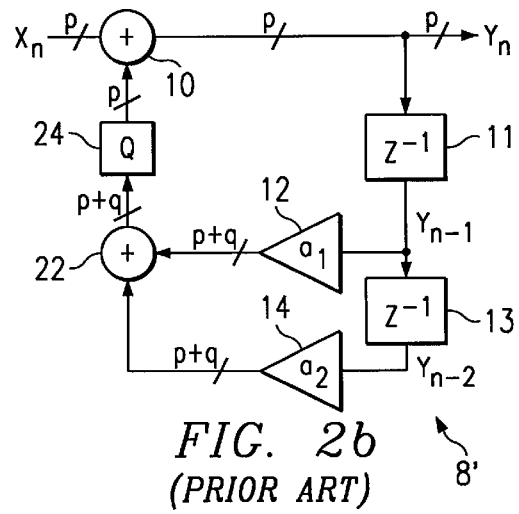
Figure 5:
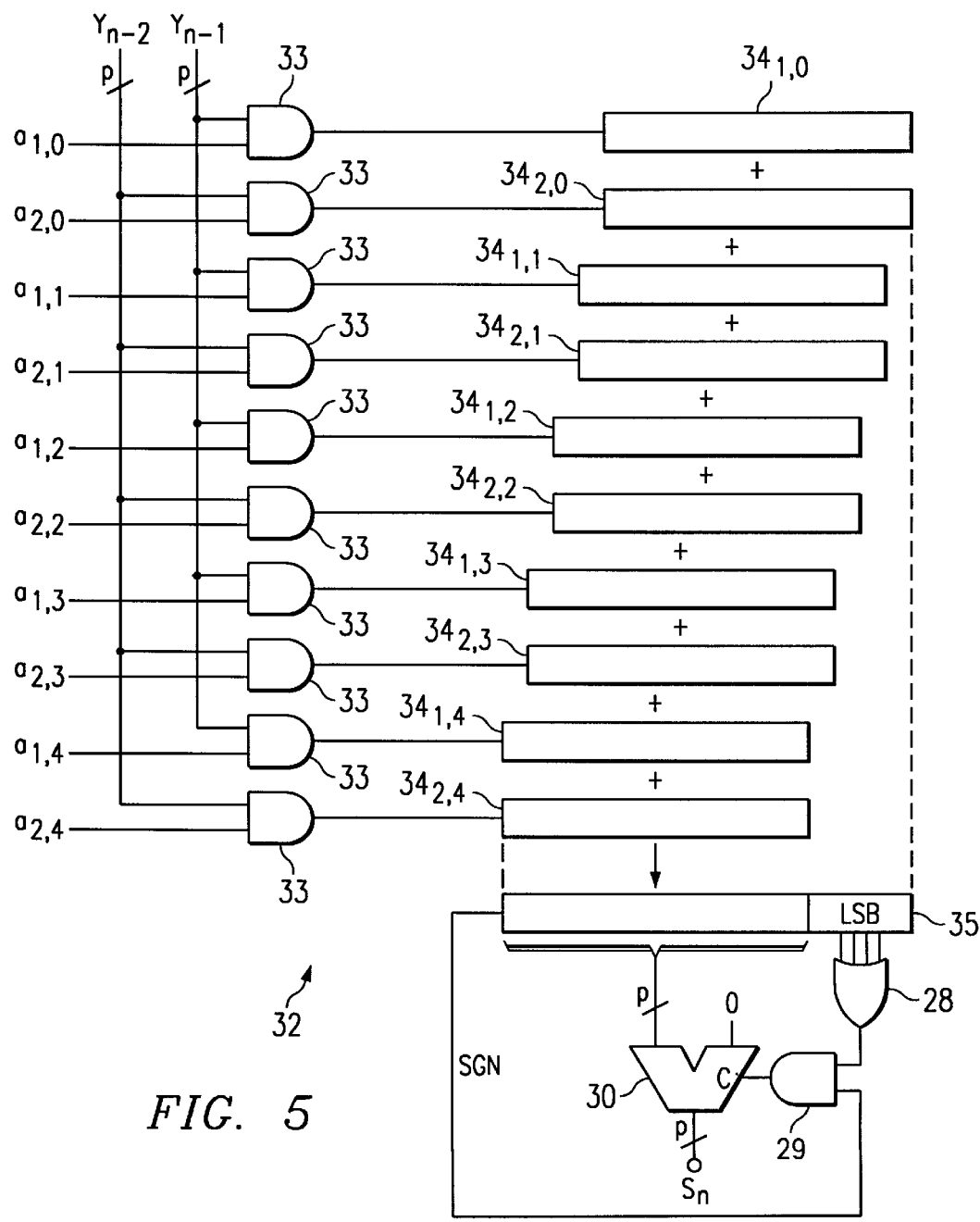
FIG. 5 is an electrical diagram, in block form, of an interleaved multiply function according to the preferred embodiment of the invention.

Referring now to FIG. 5, the interleaved addition and quantization approach utilized according to the preferred embodiment of the present invention will be described in general functional terms. Specific hardware realizations of the function of FIG. 5 will be described, by way of example, in further detail hereinbelow. For purposes of explanation, FIG. 5 illustrates the multiplication and addition operation:

$$s_n = Q_{MT}[a_1 y_{n-1} + a_2 y_{n-2}]$$

where coefficients $a_1$, $a_2$ are five-bit digital values in this example; the bit positions of these coefficients will be shown as $a_{1,0}$ (LSB of coefficient al) through $a_{2,4}$ (MSB of coefficient $a_2$). Result sn of the operation of FIG. 5 is the value added with the current input value in a recursive digital filter. For example, in filter 8' of FIG. 2b, result $s_n$ corresponds to the output of quantizer 24.

As illustrated in FIG. 5, multiplier function 32 includes a plurality of adder stages 34. Adder stage $34_{1,0}$ receives output sample value $y_{n-1}$ depending upon the state of coefficient digit $a_{1,0}$ as determined by AND function 33. For example, if digit $a_{1,0}$ is zero, adder stage $34_{1,0}$ is initially loaded with zeroes, and if digit $a_{1,0}$ is non-zero, some multiple of sample output value $y_{n-1}$ is loaded into adder stage $34_{1,0}$. Coefficient digit $a_{1,0}$ may be a single bit if coefficient $a_1$ is expressed in binary terms. Alternatively, digit $a_{1,0}$ may be a canonic sum digit (CSD) bit, having one of the values −1, 0, +1; further in the alternative, digit $a_{1,0}$ may be a multiple-bit digit resulting from Booth encoding. In any event, adder stage $34_{1,0}$ is loaded in multiplier function with a value depending upon output sample value $y_{n-1}$ and its corresponding coefficient digit $a_{1,0}$.

The next adder stage $34_{2,0}$ in multiplier function 32 receives output sample value $y_{n-2}$, depending upon the state of coefficient digit $a_{2,0}$; additionally, in conventional multiplier form, adder stage $34_{2,0}$ also receives the contents of adder stage $34_{1,0}$, and performs a partial sum therewith. Adder stage $34_{2,0}$, and all other adder stages 34, may incorporate carry operations, including look-ahead carries and other types of carry propagation, as desired in the particular implementation. The resulting contents of adder stage $34_{2,0}$ are forwarded to adder stage $34_{1,1}$.

Adder stage $34_{1,1}$ receives the contents of adder stage $34_{2,0}$, except for the least significant bit (or bits, as the case may be) thereof which is forwarded to result register 35. In addition, adder stage $34_{1,1}$ receives output sample value $y_{n-1}$, depending upon the state of coefficient digit $a_1$. Adder stage $34_{1,0}$, is shifted left by one or more bits, relative to adder stages $34_{1,0}$, $34_{2,0}$, depending upon the arrangement of coefficient $a_1$. Adder stage $34_{1,1}$, performs the addition of the partial sum from adder stage $34_{2,0}$ and the output sample value $y_{n-1}$ (as indicated by digit $a_{1,1}$), and forwards its results to adder stage $34_{2,1}$ for another addition with output sample value $y_{n-2}$ as determined by coefficient $a_2$.

Figure 3:
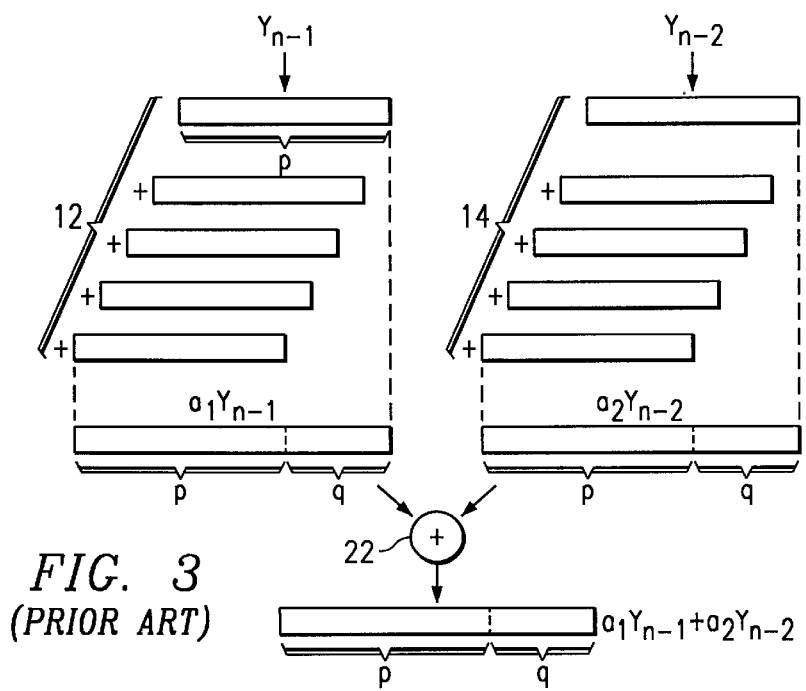
FIG. 3 is an electrical diagram, in block form, illustrating the operation and precision of multipliers and an adder in the digital filter of FIG. 2b.

Multiplication process 32 then continues through the remaining adder stages 34 in a similar manner, resulting in a value stored in result register 35, which is an p+q-bit register (n being 5 in this case), the n least significant bits of which are derived from early ones of adder stages 34. As evident from this description, multiplication process 32 utilizes output sample values $y_{n-1}$, $y_{n-2}$ in an interleaved fashion, rather than performing separate multiplications as in conventional techniques as illustrated relative to FIG. 3. This interleaving of the shifted additions in multiplication process 32 permits the realization of the recursive loops in IIR digital filters to be implemented with reduced-precision adders, as there is no requirement for an p+q-bit adder for adding products $a_1 y_{n-1}$ and $a_2 y_{n-2}$, as is required in conventional implementations.

As will become apparent from the following description, multiplication process 32 may be implemented with a reduced number of adder stages 34 if fixed-value coefficients $a_1 a_2$ are used, as only those adder stages 34 corresponding to non-zero digit values affect the result. In this case, the interleaving of adder stages 34 may not be "perfect" (i.e., alternating between output sample values $y_{n-1}$, $y_{n-2}$ as in FIG. 5), as successive adder stages associated with one of the output sample values may be required if one of the coefficients includes many zero digits. On the other hand, as will also be described in detail hereinbelow, the "perfect" interleaving of multiplication process 32 as shown in FIG. 5 can be utilized where coefficients $a_1$, $a_2$ are programmable, for example as realized in a digital signal processor (DSP) or other programmable logic device.

The approach of FIG. 5 according to the present invention also facilitates the implementation of magnitude truncation quantization, through the use of two's complement quantization as described above. As shown in FIG. 5, the least significant bits from adder stages 34 are forwarded into result register 35. In effect, these least significant bits indicate whether any fractional portion of the final sum remains; this determines, for negative final sums, whether a carry bit must be generated in order to convert the quantization function from two's complement quantization to magnitude truncation quantization. Accordingly, these least significant bits are effectively ORed by OR function 28, and applied as a carry-in to adder 30 depending upon the state of the sign-bit of result register 35, under the control of AND function 29. The output of adder 30 provides sum Sn, which is then added to the input sample value $x_n$ in realizing an IIR digital filter as discussed above. This magnitude truncation quantization eliminates limit cycles which, as described above, appear as periodic output noise generated by an IIR filter when zero-level input is provided. As is known in the art, limit cycles may also occur when a constant non-zero input is applied to an IIR filter; it is contemplated that the present invention may also resolve this type of limit cycle issue through use of a high-pass filter which removes DC components of the input signal prior to application of the IIR digital filter described herein.

Furthermore, while second-order filters are implemented according to the present invention, as described hereinabove relative to FIGS. 4 and 5 and as described hereinbelow, it is contemplated that the present invention may be utilized in higher-order filters as well. It is particularly contemplated that, as known in the art, higher order filters are realized by cascading first and second order filters, in which case the preferred embodiments of the invention described hereinbelow may be directly used. Alternatively, it is contemplated that those of ordinary skill in the art, having reference to this specification, will be readily able to implement higher-order filters using the present invention.

According to a first preferred embodiment of the invention, a recursive loop in a second-order IIR digital filter having fixed coefficients $a_1$, $a_2$ will now be described in detail. As noted above, additional implementation efficiency is provided by the fixed nature of coefficients $a_1$, $a_2$, as only those adder stages in effecting non-zero coefficient digits are necessary. As a result, the recursive loop of IIR digital filters may be readily and efficiently implemented, particularly in cases where the filter design selects values of coefficients $a_1$, $a_2$ that involve relatively few non-zero digits.

According to this first preferred embodiment of the invention, coefficients $a_1$, $a_2$ are implemented by way of canonic sum digits (CSDs), such that each digit position can represent $-1$, $0$, or $+1$. This representation is particularly useful in the case where the values of coefficients $a_1$, $a_2$ have fixed values, as will now be described.

In general, the implementation of a limit-cycle-free IIR digital filter recursive path, using fixed coefficients expressed in CSD form, can be expressed algorithmically as a sequence of partial sums S. Coefficient a, having an absolute value less than or equal to 2, may be represented by:

$$a = \sum_{i=0}^{N-1} c_i 2^{-i}$$

where $c_i \in \{-1, 0, +1\}$, and where N is the number of CSDs in coefficient a. The product $ay_{n-1}$ thus may be expressed as:

$$a \cdot y_{n-1} = \sum_{i=0}^{N-1} c_i (y_{n-1}) 2^{-i}$$

This implies that the product $ay_{n-1}$ may be obtained by summing the terms $c_i(y_{n-1})2^{-i}$ for non-zero digits $c_i$, requiring only shift and add operations. Algorithmically, consider $S_j$ as the jth partial sum of $c_i(y_{n-1})2^{-i}$. Then:

$$S_0 = c_{j0} y_{n-1} \text{ (i.e., } \pm y_{n-1}\text{)}$$

where $c_{j0}$ is the lowest-order non-zero CSD digit of coefficient a. The next partial sum $S_1$ is thus:

$$S_1 = c_{j1} y_{n-1} + \left\lfloor \frac{S_0}{2^{-(j1-j0)}} \right\rfloor$$

where j1–j0 is the binary exponent difference between the second and first non-zero CSD digits $c_{j1}$, $c_{j0}$, respectively, of coefficient a, and where brackets $\lfloor \ \rfloor$ indicate rounding toward $-\infty$. In conventional adder circuitry, partial sum $S_1$ is shifted left (i.e., higher-order) by the number of bits defined by $2^{-(j1-j0)}$, and is limited by the signal word length. This limitation on the word length of the partial sums S leaves a fractional portion $F_1$ represented as follows:

$$F_1 = \left\lceil \frac{S_0}{2^{-(j1-j0)}} - \left\lfloor \frac{S_0}{2^{-(j1-j0)}} \right\rfloor \right\rceil$$

where the brackets $\lceil \ \rceil$ indicate rounding toward $+\infty$. This fractional portion $F_1$ is 1 if the difference is non-zero. The next partial sum $S_2$, based upon the next non-zero digit $c_{j2}$, is similarly generated:

$$S_2 = c_{j2} y_{n-1} + \left\lfloor \frac{S_1}{2^{-(j2-j1)}} \right\rfloor$$

with a fractional remainder $F_2$ generated by:

$$F_2 = \left\lceil \frac{S_1}{2^{-(j2-j1)}} - \left\lfloor \frac{S_1}{2^{-(j2-j1)}} \right\rfloor \right\rceil \vee F_1$$

where $\vee$ indicates a bit-by-bit logical OR. This logical OR operation ensures that all subsequent fractional portions remain unity if any lower-order fractional portion F is unity. Upon completion of the final partial sum $S_J$, a final addition is performed to generate a final sum $S_{J+1}$, using a carry based upon the fractional portion $F_J$ if the final partial sum $S_J$ is negative. This final addition implements the magnitude truncation quantization, in the manner described above, as follows:

$$Q_{MT}(a \cdot y_{n-1}) = S_J + C_{in}, \text{ where}$$

$$C_{in} = \begin{cases} 1, & \text{for } S_J < 0 \text{ and } F_J \neq 0 \\ 0, & \text{otherwise} \end{cases}$$

Figure 6:
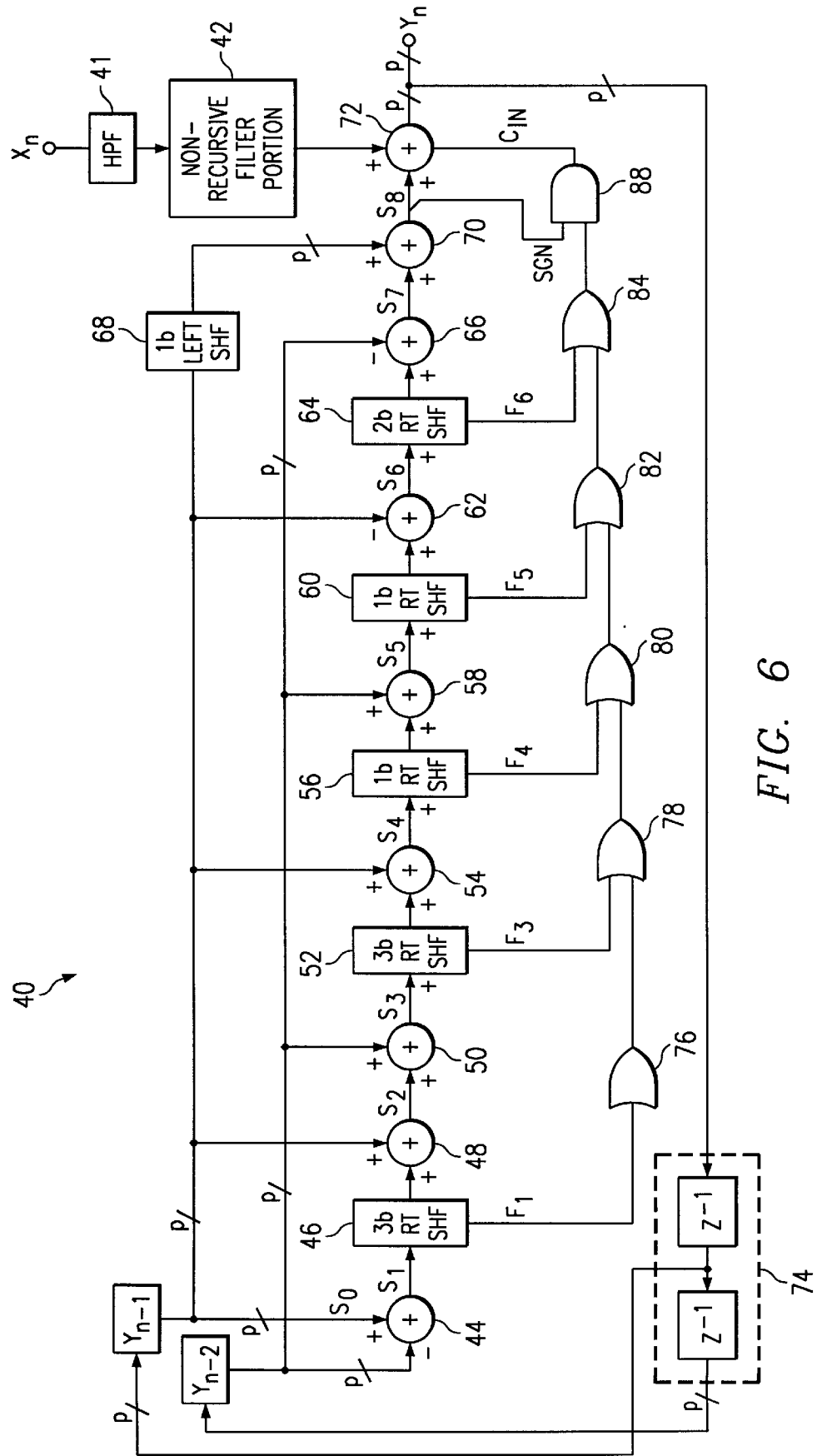
FIG. 6 is an electrical diagram, in block and schematic form, of an IIR digital filter with fixed feedback coefficients, constructed according to a first preferred embodiment of the invention.

Referring now to FIG. 6, an example of an implementation of this algorithm for generating a magnitude truncation quantized sum of products of coefficients and output sample values in a second-order IIR digital filter 40, according to a first preferred embodiment of the present invention, will now be described. According to this first preferred embodiment of the present invention, the coefficients $a_1$, $a_2$ are fixed in value, and are represented in CSD form. Accordingly, this embodiment of the invention will be described by way of an example in which values for coefficients $a_1$, $a_2$ are selected.

FIG. 6 illustrates digital filter 40 as having a non-recursive part 42, which processes current input sample value $x_n$, typically in combination with prior input sample values $x_{n-k}$ as known in the art; the output of non-recursive part 42 is applied to one input of adder 72, which generates current output sample value $y_n$ as the sum of the output of non-recursive part 42 and the output of the recursive part of digital filter 40 which will be described in detail below. In the example of FIG. 6, input sample value $x_n$ is first applied to high-pass filter 41, so that digital filter 40 is protected not only from limit cycles in the event of zero-level input, but also in the event of constant-level input at any DC level; high-pass filter 41 is, of course, optional in implementing the present invention. The current output sample $y_n$ is applied to delay stage 74, which produces previous output sample values $y_{n-1}$, $y_{n-2}$ for use in subsequent samples of second-order IIR digital filter 40. As illustrated in FIG. 6, previous output sample values $y_{n-1}$, $y_{n-2}$ are applied to a series of add and shift stages, as will now be described.

In this example, coefficients $a_1$, $a_2$ are set as follows:

$$a_1 = 1.82153 = 2 - \tfrac{1}{4} + \tfrac{1}{16} + \tfrac{1}{128} + \tfrac{1}{1024}$$

$$a_2 = -0.868127 = -1 + \tfrac{1}{8} + \tfrac{1}{128} - \tfrac{1}{1024}$$

As such, since both coefficients $a_1$, $a_2$ have their least significant non-zero digit at the same power of two, output sample values $y_{n-1}$ and $y_{n-2}$ are each applied to an input of adder 44, with output sample value $y_{n-2}$ inverted (indicated by the minus sign) because of the sign of its least significant digit. Referring back to the algorithmic description of this operation, first partial sum $S_0$ thus corresponds to output sample value $y_{n-1}$ and the next partial sum $S_1$ corresponds to the sum $y_{n-1} + (-y_{n-2})$. Partial sum $S_1$ is then applied to 3-bit shifter 46.

3-bit shifter 46 carries out a three-bit right-shift of partial sum $S_1$, forwarding the three least significant bits to OR gate 76 as fractional portion $F_1$, and forwarding the remaining most significant bits to adder 48. In effect, shifter 46 is executing a portion of two's complement quantization, by discarding fractional portion $F_1$ from partial sum $S_1$. The shift executed by shifter 46 is a three-bit shift, considering that the next least significant non-zero digit in either of coefficients $a_1$, $a_2$ differs from the prior non-zero digit by a factor of $2^3$ ($2^{-7} \div 2^{-10}$). Adder 48 also receives output sample value $y_{n-1}$, and forwards its output (partial sum $S_2$) to one input of adder 50, which receives output sample value $y_{n-2}$ at its other input. No shifter is present between adders 48, 50, as each of coefficients $a_1$, $a_2$ have a non-zero digit in this same bit position ($2^{-7}$). The output of adder 50 corresponds to partial sum $S_3$, and is applied to 3-bit shifter 52, considering that the next least significant non-zero digit ($2^{-4}$ in coefficient al) in either of coefficients $a_1$, $a_2$ differs from the previous ($2^{-7}$) by a factor of $2^3$. Fractional portion $F_3$ is forwarded from shifter 52 to OR gate 78, which also receives the output of OR gate 76 at another input; in this way, any non-zero fractional portion in least significant bit positions (e.g., $F_1$) propagates through OR gate 78.

The shifted output from shifter 52 is applied to adder 54, which receives output sample value $y_{n-1}$ at its other input, and which generates partial sum $S_4$ at its output. Partial sum $S_4$ is applied to one-bit shifter 56, considering that the next least significant non-zero digit ($2^{-3}$ in coefficient $a_2$) differs from the previous by a factor of 2. Shifter 56 thus generates a one-bit fractional portion $F_4$ applied to OR gate 80 along with the output of OR gate 78; the shifted output from shifter 56 is applied to one input of adder 58, which receives coefficient $y_{n-2}$ at its other input. The output of adder 58, corresponding to partial sum $S_5$ is applied to one-bit shifter 60, as the next least significant non-zero digit ($-2^{-2}$ in coefficient $a_1$) differs from the previous ($2^{-3}$ in coefficient $a_2$). Shifter 60 generates a one-bit fractional portion $F_5$, which is applied to one input of OR gate 82, the other input of which receives the output of OR gate 80.

Shifter 60 also forwards the shifted partial sum $S_5$ to one input of adder 62. Because the non-zero coefficient digit ($2^{-2}$ in coefficient $a_1$) is negative, adder 62 receives the inverted value of output sample value $y_{n-1}$, based upon which it generates partial sum $S_6$ which is applied to 2-bit shifter 64 (considering that the next non-zero coefficient digit is $-2^0$ in coefficient $a_2$. Shifter 64 generates a two-bit fractional portion $F_6$, and applies these two bits to OR gate 84, which also receives the output of OR gate 82. The shifted output of shifter 64 is applied to one input of adder 66, which receives output sample value $y_{n-2}$ (inverted by the negative coefficient $a_2$ digit in the $2^0$ place) at its other input, and which generates partial sum $S_7$ at its output. As this partial sum is based upon the $2^0$ coefficient digit, no fractional portion is generated. Partial sum is applied to one input of adder 70. Output sample value $y_{n-1}$ is applied to one-bit shifter 68, to effect a multiply-by-two operation (considering most significant digit $2^1$ in coefficient $a_1$), the result of which is applied to another input of adder 70. Adder 70 generates final partial sum $S_8$, which is applied to final adder 72.

The output of OR gate 84 is based upon the state of the fractional portions $F_1$ through $F_6$ generated by the various shifters in digital filter 40; the output of OR gate 84 is low ("0") only if all fractional portions $F_1$ through $F_6$ are zero. OR gate 84 presents its output to one input of AND gate 88, the other input of which receives the most significant (i.e., sign) bit from final partial sum $S_8$. As described above, because two's complement quantization is being carried out, conversion to magnitude truncation quantization is carried out by adding "1" to the final partial sum if the final partial sum is both negative and not an integer. As such, AND gate 88 generates a signal at its output, on line $C_{in}$ which is applied to final adder 72, in response to line SGN being high (indicating that two's complement final partial sum $S_8$ is negative) in combination with the output of OR gate 84 being high (at least one of the fractional portions $F_1$ through $F_6$ being non-zero). Final adder 72 adds the final partial sum $S_8$, carry-in-bit $C_{in}$, and the output of non-recursive portion 42, to generate current output sample value $y_n$.

As illustrated by this exemplary embodiment of FIG. 6, IIR digital filter 60 efficiently incorporates the recursive loop without requiring adders that are of extended precision relative to the signal values; each of adders 44, 48, 50, 54, 58, 62, 66, 70, 72 are p-bit adders, in this case where output sample value $y_n$ is an p-bit value. Additionally, because of the magnitude truncation quantization that is implemented in this example, limit cycles are precluded from occurring in digital filter 40 in the event of a zero-level input (or, considering the presence of high-pass filter 41, in the event of any constant-level input).

Digital filter 40 according to this first preferred embodiment of the present invention, considering that coefficients $a_1$, $a_2$ have fixed values, is contemplated to be of particularly beneficial use in those applications that may utilize a dedicated digital signal processing function. FIG. 7 illustrates an example of such an application, in which digital filter 40 is included within an analog "front-end" function of a digital subscriber line (DSL) modem in a telecommunications system.

FIG. 7 illustrates a typical system installation of DSL services, in which multiple remote subscribers interface with a telephone system central office. In this example, a user in a home or office environment operates remote computer system R, such as a personal computer or workstation, or alternatively an entertainment unit in the video-on-demand (VOD) context. Each of remote computer systems R serves as a remote source and destination of communicated data, which may be representative of text, graphics, motion pictures, audio, etc. Each remote system R is associated with a remote DSL modem 115, by way of which the remote system R communicates with central office DSM modem 108 over a conventional twisted-pair telephone facility TWP. One or more telephones (not shown) may also be connected into each twisted pair wire facility TWP, such that "Plain Old Telephone Service" (POTS) voice communications may alternatively or additionally be communicated over twisted pair wire facility TWP. The DSL technology in the specific example of FIG. 7 may be of the asymmetric type (i.e., ADSL), with traffic traveling from central office modem 108 to remote modems 115 at a signal bandwidth that is higher in frequency than that of traffic traveling from remote modems 115 to central office modem 108 (i.e., upstream).

As illustrated in FIG. 7, each of twisted pair wire facilities TWP is received by central office DSL modem 108, which is contemplated to be located in a central office of the local or long distance telephone service provider. Central office modem 108, in this example, is capable of receiving multiple twisted pair wire facilities TWP (only two of which are illustrated in this example). Central office modem 108 provides communication of data between twisted pair wire facilities TWP, and thus remote systems R, and a host computer (not shown in FIG. 7) which serves as the source or destination of data, or as an intermediate gateway to a network, such as the Internet, or a dedicated "dial-up" content provider or network. Of course, the central office will typically also include switchgear for the routing of calls such as those placed by remote systems R (or associated telephones) over twisted pair wire facilities TWP. As noted above, central office modem 108 will likely be connected to a backbone network, which in turn is in communication with other communication paths by way of equipment such as routers or Digital Subscriber Line Access Multiplexers (DSLAMs). In the application where POTS service overlays the ADSL data traffic, such equipment may also include some type of "splitter" for separating POTS from the data traffic, routing the POTS traffic to the conventional telephone network (PSTN) and routing the data to a wide-area network (WAN).

In the example of FIG. 7, remote DSL modems 115 are each arranged as a plurality of functions, which roughly correspond to individual integrated circuits in this exemplary embodiment of the invention. It is of course to be understood that the particular integrated circuit, or "chip", boundaries among these various functions may vary among implementations; the exemplary realization illustrated in FIG. 7 is provided by way of example only. In this example, each of remote DSL modems 115 include a host interface 107, for interfacing digital transceiver function 113 with its associated remote system R. Host interface 107 is of conventional construction for such interface functions, an example of which is the TNETD2100 digital serial bus interface circuit available from Texas Instruments Incorporated.

According to this embodiment of the invention, digital transceiver function 113 in remote DSL modems 115 is a programmable device for executing the necessary digital processing operations for both transmission and receipt of the data payload. These operations include such functions as formatting of the digital data from the host computer system (into packets and frames, for example), encoding of the data into appropriate subchannels for transmission, and performing an inverse Fast Fourier Transform (IFFT) to transform the encoded data into time domain signals; on the receive side, digital transceiver function 13 performs the reverse of these operations, as well as echo cancellation processing. Particularly at the data rates discussed hereinabove, the digital data processing capacity and power of digital transceiver function 113 is preferably of a high level; an example of an architecture suitable for use as digital transceiver function 113 is a digital signal processor such as the TMS320C6x type, available from Texas Instruments Incorporated.

Each digital transceiver function 113 is bidirectionally connected to AFE 111, which is a mixed-signal (i.e., involving both digital and analog operations) integrated circuit which provides all loop interface components necessary for DSL communications other than those which involve high voltages. In this regard, AFEs 111 in each of remote DSL modems 115 perform both transmit and receive interface functions. In turn, AFEs 111 in each of remote modems 115 bidirectionally interface with line driver 117, which is a high-speed line driver and receiver for driving and receiving the ADSL signals on twisted pair facility TWP, such as the THS6002 line driver available from Texas Instruments Incorporated. Line drivers 117 in remote modems 115 are connected to a four-wire to two-wire "hybrid" integrated circuit 119, which converts the dedicated transmit and receive lines from line driver 117 to the two-wire arrangement of twisted pair facility TWP, in full-duplex fashion.

In the central office, central office DSL modem 108 includes host interface 109 which connects modem 108 to a host computer (not shown). Host interface 109 may, as noted above, be implemented by conventional circuitry such as the TNETD2100 digital serial bus interface circuit available from Texas Instruments Incorporated. As noted above, the host computer will interface central office modem 108 to a splitter for separating POTS from the data traffic, as noted above, and thus to the conventional telephone network (PSTN) and wide-area network (WAN) as appropriate for the service being provided. Central office modem 8 includes digital DSL transceiver function 110, which connects to multiple analog front end functions (AFEs) 112 as shown in FIG. 7.

Digital transceiver function 110 is similarly constructed as and performs similar processing to digital transceiver functions 113 in remote DSL modems 115, with certain differences in function arising from the different frequencies of its received and transmitted traffic, as will be described in detail hereinbelow. As before, digital transceiver function 110 is preferably implemented as a high-performance digital signal processor, such as the TMS320C6x, available from Texas Instruments Incorporated.

Digital filter 40, described hereinabove relative to FIG. 6, may be implemented in its dedicated, fixed coefficient, form, in AFEs 111, 112, particularly at those locations at which IIR digital filtering is to be performed. Referring now to FIG. 8, an example of the arrangement of AFE 111 in remote modems 115 which incorporates digital filter 40 will now be illustrated.

Referring now to FIG. 8, the construction and operation of AFE 111 in remote modems 115 will now be described in detail; the construction of AFE 112 in central office modem 108 may be quite similar, but of course will be modified as necessary to handle the different bandwidth signals. As noted above, it is contemplated that AFE 111 may be readily integrated into a single integrated circuit, either limited to its functions or alternatively integrated with certain of the other functions such as digital transceiver function 113, line driver 117, and the like. AFE 111 according to this embodiment of the present invention is intended to provide all loop interface components that are not exposed to high voltages, such as a high-pass filter, transmitter power driver, four-wire to two-wire hybrid, and a receiver coarse programmable gain amplifier, such elements being external to AFE 111 (e.g., implemented within line driver 117 and hybrid 119).

AFE 111 includes a transmit side and a receive side, along with a second transmit side 153, which is identical to the signal transmit side illustrated in FIG. 8, for purposes of providing time domain echo cancellation. In this regard, echo cancellation transmit side 153 drives lines ECP, ECM with analog signals corresponding to those generated by AFE 111 on lines TXP, TXM; lines ECP, ECM are applied to common nodes RXP, RXM externally from AFE 111 (e.g., at line driver 117), to provide a copy of the low-frequency upstream transmit signal that can be used by digital transceiver function 113 to cancel any echo signal generated by the transmit side of AFE 111.

In this embodiment of the invention, the transmit (both primary and echo cancellation transmit side 153) and receive sides share interface and control function 142R, by way of which AFE 111 communicates with digital transceiver 113. Interface and control function 142R includes a parallel digital interface, by way of which digital words to be transmitted by remote system 108 are received by AFE 111, and by way of which data received from twisted pair facility TWP and processed by AFE 111 are communicated as digital words to digital transceiver 113. Interface and control function 142R also includes the appropriate signal interface for receiving and providing control information from and to digital transceiver 113. Clock circuitry 166R is shared by the transmit and receive sides of AFE 111, and provides the corresponding clock control for synchronous operation thereof. Voltage reference 168R, preferably a stable voltage reference circuit such as a bandgap reference, is also shared by the transmit and receive sides of AFE 111. Other circuitry used in the operation of AFE 111, such as power supply distribution and regulation, general purpose port communications, and the like, may of course also be included therein, but is not shown for purposes of clarity of this description. As shown in FIG. 8, AFE 111 also includes oversampling register 44R which comprises one or more register stages, as may be used in AFE 111 in realizing certain digital filter operations.

Referring now to the signal transmit side of AFE 111, digital filter 140 receives digital data words from oversampling registers 144R, and implement digital filter operations upon these digital data words, prior to digital-to-analog conversion. The digital filtering process executed by AFE 111 may include multiple options and functions, selectable depending upon the frequency and characteristics of the digital data provided by digital transceiver function 110. Such multiple functions may include an interpolation filter for increasing the sample rate, and a digital high pass filter.

It is contemplated that digital filters 140 in AFE 111 will typically include a digital low pass filter, however, to effect band-limiting on the digital data so as to ease the complexity of the downstream analog filtering. It has been observed, according to the present invention, that the analog filtering of upstream DSL communications can be reduced from a fourth order analog filter to a second order analog filter through use of a digital low pass filter; noise contribution of downstream analog filtering is also reduced, as well. According to the preferred embodiment of the invention, such a digital low pass filter process is realized in digital filter 140 by way of an infinite impulse response (IIR) implementation with a corner frequency at about the high frequency limit of the lower-frequency bandwidth. A particularly advantageous realization of digital low pass filter is a third order IIR filter that approximates an elliptic response with minimal (±0.5 dB) pass-band ripple. A preferred exemplary realization utilizes a time-domain filter equation as follows:

$$y_n = a_1 y_{n-1} + a_2 y_{n-2} + a_3 y_{n-3} + b_1 x_{n-1} + b_2 x_{n-2} + b_3 x_{n-3}$$

where the tap weight coefficients are defined as follows:

$$b_1 = b_3 = 2^{-7} - 2^{-10}$$

$$b_2 = -2^{-7} + 2^{-10}$$

$$a_1 = 2 + 2^{-1} + 2^{-3} + 2^{-4} - 2^{-8} - 2^{-11}$$

$$a_2 = -2 - 2^{-1} + 2^{-4}$$

$$a_3 = 2^{-1} + 2^{-2} - 2^{-9}$$

This particular implementations deviates from the ideal digital elliptic filter to a slight extent, in order to reduce circuit complexity by maintaining powers-of-two coefficients (which may be implemented without multipliers). This deviation has been observed to result only in a 0.25 dB droop at the corner frequency, which is tolerable in this application, and involving minimal group delay.

According to the preferred embodiment of the invention, and particularly for implementing a known standard such as the T1E1.413 standard, this third-order IIR digital filter is implemented in AFE 111 by way of a second-order IIR filter as described above as digital filter 40, in cascade with a first-order filter to achieve the proper characteristic. Further, considering that AFE 111 is preferably integrated into a single integrated circuit, the tap weight coefficients noted above are preferably hard-wired into AFE 111 through the construction of the shift and add stages in digital filter 140, as described above relative to FIG. 6. The advantages of efficient integration, and limit-cycle free operation, will be of significant benefit in the DSL communications provided by way of AFE 111.

Referring back to FIG. 8, the output of digital filter 140 is then applied to digital-to-analog converter (DAC) 148R for conversion into an analog signal. The analog output of DAC 148R is filtered by analog low-pass filter 150R, for example by way of a second-order Chebyshev continuous-time filter, implemented according to conventional techniques, and having a nominal 166 kHz passband. This relatively simple analog filter is enabled by the extent of the digital filtering previously provided by filters 140 discussed above. The output of analog low pass filter 150R is presented to programmable attenuator 152R, which is constructed according to conventional techniques to provide 0 dB to −24 dB attenuation, selectable in 1 dB steps. The output of programmable attenuator 152R is presented on lines TXP, TXM to line driver 117, and corresponds to an analog signal corresponding to the data to be transmitted, encoded in the manner implemented by digital transceiver 113, and with the frequency characteristics specified by the applicable DSL standard, such as T1E1.413.

Referring now to the receive side of AFE 111, lines RXP, RXM, which are driven by line driver 117 in response to communication signals received over twisted pair facility TWP from central office modem 8, are received by equalizer 57 which compensates for line attenuation over twisted pair facility TWP, particularly at the higher frequencies at which downstream data are communicated in ADSL technology. The output of equalizer 157 is applied to analog low pass filter 158R which, in this example, is a fourth order elliptic continuous-time filter having a nominal 1.325 MHz pass band. The output of analog low pass filter 158R is applied to programmable gain amplifier 160R which, in this example, provides a frequency independent gain over the signal bandwidth of 30 kHz to 1104 kHz ranging from about 2.5 dB to about 11.5 dB in 0.25 dB steps. The output of second programmable gain amplifier 160R is applied to ADC 162R, converts the received analog signal into digital words at a fixed sample rate.

The output of ADC 162R is applied to digital filters 164R which, in this example, performs a two-pole, two-zero digital low pass filter function, to attenuate noise generated by equalizer 157 and analog low-pass filter 158R. Additional digital filtering, including a decimation filter to reduce the sample rate. While digital filters 164R may utilize the present invention, for example according to the first preferred embodiment described hereinabove, it is contemplated that these filters may be realized by way of FIR filters, in which case the particular benefits of eliminating limit cycles provided by the present invention would not be obtained. The output of digital filters 164R is then presented to interface and control circuitry 142R, for communication to digital transceiver 113 as noted above.

AFE 112 may be constructed similarly as AFE 111, but with differences incorporated thereinto because of the different frequency bands utilized for upstream and downstream communication in ADSL technology. To the extent that IIR digital filters are implemented within AFE 112, the present invention, particularly in the case of fixed coefficient recursive loop design as described hereinabove relative to FIG. 6, will be of particular benefit.

According to a second preferred embodiment of the present invention, the digital filter coefficient values are programmable, so as to be selectable under software control. This second preferred embodiment of the invention therefore necessarily requires "perfect" interleaving of adder stages, such as described hereinabove relative to FIG. 5, as the coefficient values will be able to take any one of a number of values within a certain range in this programmable embodiment. As such, it is contemplated that the programmability of coefficient values in the recursive loop of an IIR digital filter, according to the present invention, will be best accomplished in a programmable logic device, such as a digital signal processor (DSP), as will be described hereinbelow relative to a second-order IIR digital filter.

According to this second preferred embodiment of the present invention, the coefficients $a_1$, $a_2$ are preferably Booth encoded in computing the product $a_j \cdot y_{n-j}$. Booth encoding, which is a well-known technique used in digital multipliers, considers the multiplier (i.e., coefficient) in groups of bits, and assigns a multiplicative factor to each group. For example, three-bit Booth encoding considers three bit groups of the multiplier (with one-bit overlap between groups), and assigns a multiplicative factor from the set of $\{-2, -1, 0, +1, +2\}$ for the group. In the case of a second-order digital filter where each coefficient $a_1$, $a_2$ has an even number of bits, fewer than the number of bits of the output sample values $y_{n-1}$, $y_{n-2}$, three-bit Booth encoding will reduce the number of steps required to compute the product QMT$[a_1 y_{n-1} + a_2 y_{n-2}]$ by a factor of two from that which would be required in a pure binary multiplication.

The operations required to compute this product will now be described in terms of an algorithm. In this description, the Booth encoding begins with generation of a first Booth term Booth$_0$, which uses bits $c_1$, and $c_0$ of a coefficient a, together with a lower-order "0". The first partial sum $S_0$ is given by:

$$S_0 = Booth_0(y_{n-1})$$

The next partial sum $S_1$ utilizes the Booth encoding of bits $c_3$, $c_2$, $c_1$ of coefficient a to generate a Booth term Booth$_1$:

$$S_1 = Booth_1(y_{n-1}) + \left\lfloor \frac{S_0}{4} \right\rfloor$$

A first fractional part $F_1$ results from the effective shifting of the product, as follows:

$$F_1 = \left\lceil \frac{S_0}{4} - \left\lfloor \frac{S_0}{4} \right\rfloor \right\rceil$$

The generation of these partial sums continue, with each successive partial sum S including division of the previous partial sum by a factor of 4 (considering that three-bit Booth encoding is being used). In general:

$$S_k = Booth_k(y_{n-1}) + \left\lfloor \frac{S_{k-1}}{4} \right\rfloor$$

and $$F_k = \left\lceil \frac{S_{k-1}}{4} - \left\lfloor \frac{S_{k-1}}{4} \right\rfloor \right\rceil \vee F_{k-1}$$

The final sum $S_J$ is generated as simply the sum of $S_{J-1}$ and a carry in, where the carry in is computed as discussed above (i.e., "1" for a final partial sum $S_{J-1}$ that is both negative and not an integer; "0" otherwise).

Figure 9:
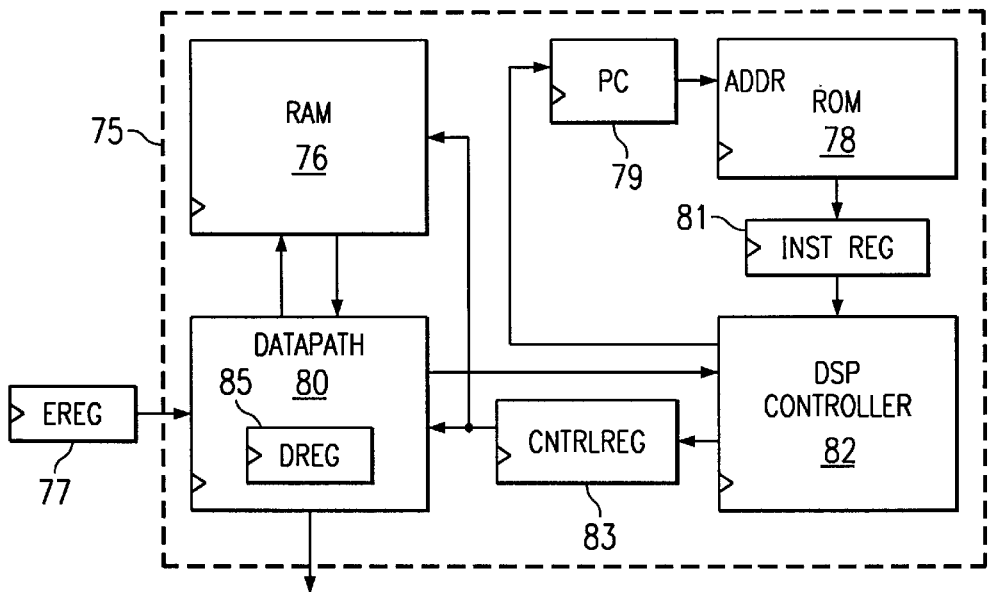
FIG. 9 is an electrical diagram, in block form, of a digital signal processor constructed according to a second preferred embodiment of the invention.

This algorithm may be readily implemented into the architecture of a digital signal processor (DSP), as will now be described in detail relative to FIG. 9. In FIG. 9, DSP 75 is illustrated in block form. According to this embodiment of the invention, DSP 75 includes random access memory (RAM) 76, read-only memory (ROM) 78, datapath (also referred to as an arithmetic logic unit, or ALU) 80, and controller 82. In this embodiment of the invention, input sample values are received by DSP 75 by datapath 80 polling external register (EREG) 77, and communicating the input values to RAM 76. Datapath 80 is controlled, in this embodiment of the invention, by DSP controller 82 which responds to instruction codes retrieved from ROM 78 according to an address stored in program counter 79, such instruction codes being buffered by instruction register 81 prior to being applied to DSP controller 82. Control register 83 is provided, in communication with DSP controller 82 and datapath 80, for storing control and status information. Data register (DREG) 85 in datapath 80 stores the output result, for presentation upon data lines D; for example, when DSP 75 is executing a digital filter operation as will be described in detail hereinbelow, DREG 85 will buffer output sample values yn.

Figure 10:
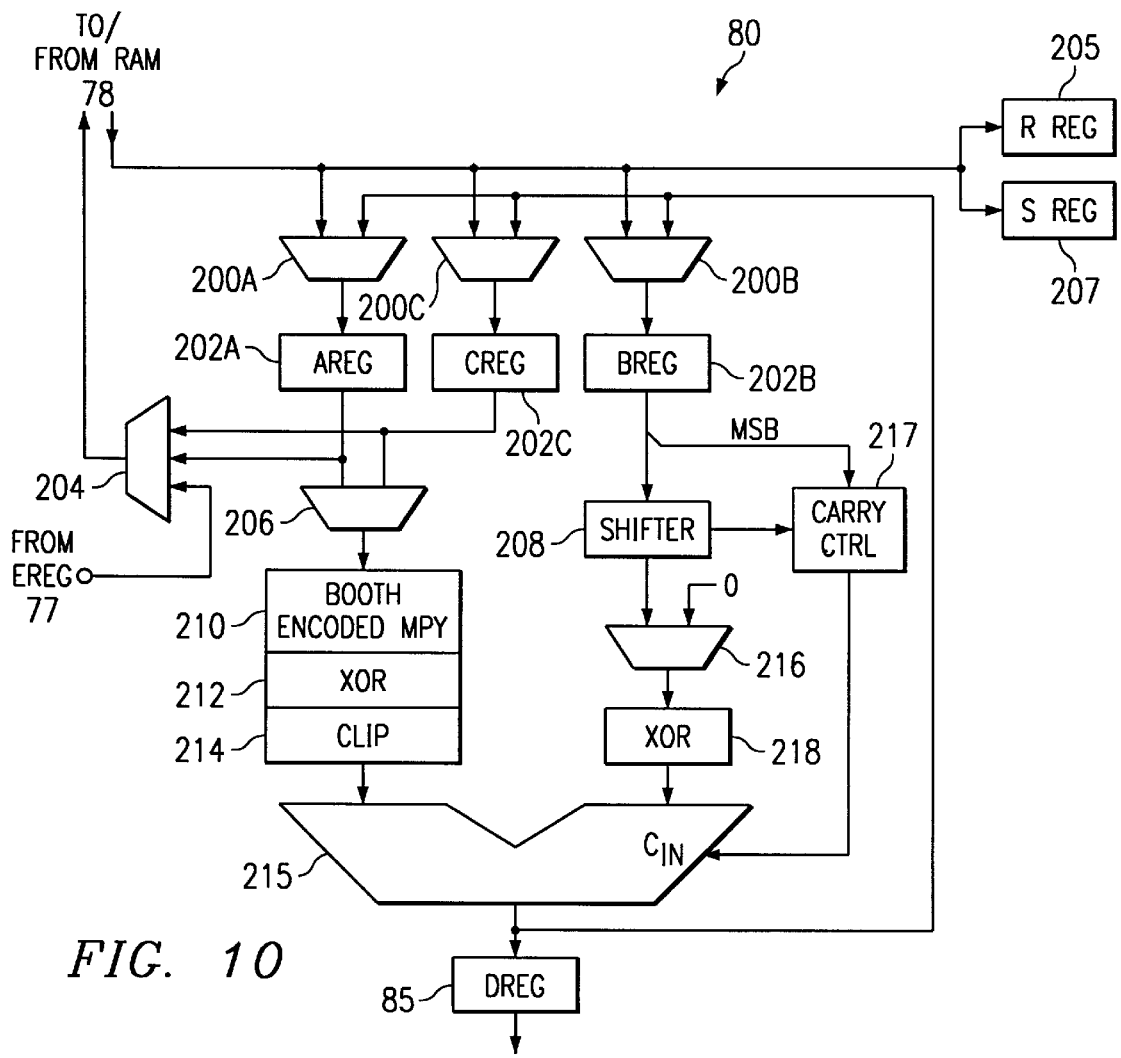
FIG. 10 is an electrical diagram, in block form, of the datapath of the digital signal processor of FIG. 9 constructed to a first alternative implementation according to the second preferred embodiment of the invention.

Referring now to FIG. 10, the construction of datapath 80 according to a first realization of this second preferred embodiment of the invention will now be described in detail. In the example of datapath 80, input sample values are received from EREG 77 and applied, via multiplexer 204, to RAM 76. Data read from RAM 76 are applied to inputs of multiplexers 200A, 200C, 200B, as are data from adder 215 in datapath 80. Data from RAM 76 may also be input to R register 205 and S register 207 which, according to this embodiment of the present invention, store the coefficient values $a_1$, $a_2$; the contents of registers 205, 207 are forwarded to DSP controller 82, which controls datapath 80 to execute the appropriate shift and multiply operations based upon these coefficients $a_1$, $a_2$. Multiplexers 200A, 200C, 200B have their outputs applied to registers 202A, 202C, 202B, respectively; control inputs (not shown) from DSP controller 82 control the selections made by multiplexers 200 according to the particular instruction under execution.

The output of registers 202A, 202C are applied to memory multiplexer 204, by way of which data are written from datapath 80 to RAM 76. These outputs of registers 202A, 202C are also applied to inputs of multiplexer 206, which has an output forwarded to a series of arithmetic and logic units. These ALUs include Booth encoded multiplier 210, and exclusive-OR function 212. Together, multiplier 210 and XOR 212 multiply an operand by a selected value in the set {−2, −1, 0, +1, +2}, depending upon the state of control lines (not shown) applied thereto by DSP controller 82; in this embodiment of the invention, DSP controller 82 issues the appropriate Booth encoded value based upon the values in registers 205, 207, the selected bit group therein, and the particular cycle under execution. Exclusive-OR block 212 follows Booth encoded multiplier 212, after which clip circuit 214 is provided to prevent overflow conditions in the final result. The output of clip circuit 214 is applied to one input of adder 215.

Alternatively, datapath 80 may utilize alternative coefficient formats in performing the appropriate add and shift operations in effecting the interleaved multiplication operation according to the preferred embodiment of the invention. For example, the coefficient values $a_1$, $a_2$ may be applied in canonic sum digit (CSD) form; this approach can save machine cycles in the operation by eliminating addition operations for zero-value coefficient digits, as described above. This approach may be particularly beneficial in the case where the digital filter utilizes fixed values of the coefficients, as these fixed values may be incorporated into a microcoded routine for effecting the filter. Other alternative approaches may also be used.

Referring back to FIG. 10, the output of register 202B, on the other hand, is applied to shifter 208, which shifts the "B" operand by a selectable number of bits, under the control of DSP controller 82. The shifted output from shifter 208 is applied to multiplexer 216 (along with a zero value), the output of which is applied to exclusive-OR block 218 and then to a second input of adder 215. The least significant bits shifted out from shifter 208 are applied to carry control 217, along with the most significant bit of the B operand from register 202B. Carry control 217 applies a signal to the carry-in input of adder 215 based upon these signals, as will be described in further detail hereinbelow.

Adder 215 applies its output both back to inputs of multiplexers 200A, 200C, 200B, and also to data register 85. As discussed above, data register 85 buffers the output sample values for communication to external from DSP 75.

The operation of datapath 80 in executing an instruction according to this second preferred embodiment of the invention, by way of which the quantized sum of products QMT[$a_1 y_{n-1} + a_2 y_{n-2}$] is generated, where multiplications are carried out in a Booth-encoded manner, and where the result is quantized according to a magnitude truncation approach, such as is useful in executing the recursive loop of a second-order IIR digital filter, will now be described in detail.

Firstly, coefficients $a_1$, $a_2$ are retrieved from RAM 76, and are stored by datapath 80 in registers 205, 207, for access by DSP controller 82. These coefficient values remain constant, at least for the execution of this particular recursive loop operation. In this example, the coefficients $a_1$, $a_2$ will have the following values:

$a_1 = 1.82153 = 01.11010010_2$ $a_2 = -0.86813 = 11.00100010_2$

The ten-bit two's complement representations of coefficients $a_1$, $a_2$ utilize their MSB as a sign-bit, one integer bit, and eight fraction-bits. By way of reference, the Booth encoding table for three-bit Booth encoding is as follows:

| Coefficient bits | Booth term |
| --- | --- |
| 000 | 0 |
| 001 | +1 |
| 010 | +1 |
| 011 | +2 |
| 100 | −2 |
| 101 | −1 |
| 110 | −1 |
| 111 | 0 |

An input sample value x, may next be received from external register 77, and stored in memory via multiplexer 204. At this point, the output sample values $y_{n-1}$ and $y_{n-2}$ are retrieved from RAM 76, and stored in registers 202A, 202C, respectively.

The generation of the first partial sum $S_0$ is now performed, by datapath 80 controlling multiplexer 206 to select register 202A (output sample value $y_{n-1}$) for application to Booth encoded multiplier 210. DSP controller 82 applies the appropriate control lines corresponding to the lowest order Booth term Booth$_0$; in this case, the two LSBs $c_1$, $c_0$ of coefficient $a_1$ plus the implied zero (100) results in Booth term Booth$_0$ of −2, from the above table. Inversion is effected, in this case, by exclusive-OR function 212, considering that all values are in two's complement form in datapath 80. As such, the output of Booth encoded multiplier 210 and exclusive-OR function 212 (and thus the output of clip circuit 214 applied to adder 215), is the partial sum S=0:

$S_0 = -2 y_{n-1}$

Multiplexer 216 is controlled to select its 0 input, such that the output of adder 215 is simply partial sum $S_0$, which is stored in one of the registers (e.g., register 202B).

Partial sum $S_1$ is next generated by multiplexer 206 selecting the output of registers 202C (which stores output sample value $y_{n-2}$) for application to Booth encoded multiplier 210. Booth encoded multiplier 210 is controlled by DSP controller 82 to apply the lowest order (for coefficient $a_2$) Booth term Booth, thereto, resulting in the generation of the value $-2 y_{n-2}$ in this example (Booth$_1 = -2$, due to the LSBs $c_1$, $c_0$ of coefficient $a_2$ being 10 as in the case of coefficient $a_1$). Inversion is handled by exclusive-OR function 212. Meanwhile, the contents of register 202B (partial sum $S_0$) are forwarded through shifter 208 without shift, and selected by multiplexer 216 for application to adder 215. Adder 215 then generates partial sum $S_1$ as follows:

$S_1 = -2 y_{n-2} + S_0$

Partial sum $S_1$ is then stored in registers 202B.

The process of generating the sequence of partial sums then continues, with output sample value $y_{n-1}$ again retrieved from RAM 76 (or from some other local register), and stored in register 202A. This value is applied to Booth encoded multiplier 210 (via multiplexer 206), and multiplied by the next Booth term Booth$_2$. In this case, the Booth encoding analyzes bits $c_3$, $c_2$, $c_1$ of coefficient $a_1$, thus generating Booth term Booth$_2$ as +1. The output of clip circuit 214 (assuming no overflow) applied to one input of adder 215 is thus $+y_{n-1}$. Meanwhile, partial sum $S_1$ is applied from register 202B to shifter 208, and shifted right two bit positions to correspond to the higher order multiplication being carried out by Booth encoded multiplier 210.

The least two significant bits of partial sum $S_1$ are applied to carry control 217 (and are effectively ORed therein), and the shifted output of shifter 208 (which corresponds to partial sum $S_1$ divided by four) is applied to the second input of adder 215; no carry-in is generated at this point. Adder 215 then generates the next partial sum $S_2$ as follows:

$$S_2 = y_{n-1} + \left\lfloor \frac{S_1}{4} \right\rfloor$$

This partial sum $S_2$ is then fed back and stored in register 202B, as before.

Partial sum $S_3$ is then generated in a similar fashion except that coefficient $y_{n-2}$ is applied to Booth encoded multiplier 210, and that partial sum $S_2$ stored in register 202B is not shifted by shifter 208, considering that the bit positions in coefficient $a_2$ that generate Booth term $Booth_3$ are the same as those in coefficient $a_1$ that generated Booth term $Booth_2$ (i.e., the multiplications are of the same power). Partial sum $S_3$ is then stored in register 202B, as before.

The process of generating partial sums $S_4$ through $S_1$, in this example, is then continued in similar fashion, but alternating between coefficients $y_{n-1}$, $y_{n-2}$ for each pass, and shifting by a factor of four in alternating passes. In this example, with the above values of coefficients $a_1$, $a_2$, the partial sums $S_3$ through $S_1$ correspond to the following:

$$S_4 = y_{n-1} + \left\lfloor \frac{S_3}{4} \right\rfloor$$

$$S_5 = -2y_{n-2} + S_4$$

$$S_6 = -y_{n-1} + \left\lfloor \frac{S_5}{4} \right\rfloor$$

$$S_7 = y_{n-2} + S_6$$

$$S_8 = 2y_{n-1} + \left\lfloor \frac{S_7}{4} \right\rfloor$$

$$S_9 = -y_{n-2} + S_8$$

Upon generation of the final partial sum $S_9$, datapath 80 generates the final sum $S_{10}$ (which, together with any non-recursive term, generates current output sample value $y_n$), by applying final partial sum $S_9$ to adder 215, preferably via register 202B, so that the MSB of final partial sum $S_9$ is applied to carry control 217 (the other input of adder 215 is preferably set to 0). A carry-in-bit to adder 215 is generated by carry control 217 determining whether final partial sum $S_9$ is negative (its MSB "1") and, if so, whether any of the shifted out bits from shifter 208 during the process (corresponding to fractional parts F) were non-zero; if both conditions are satisfied, a "1" is applied to the carry-in input of adder 215, so as to increment final partial sum $S_9$ by one in generating final sum $S_{10}$. In any event, final sum $S_{10}$ is then forwarded to RAM 76, via a selected one of registers 202.

As is evident from this description, progranmmable logic, particularly the datapath in a DSP device, can readily and efficiently implement the generation of the recursive portion of a second-order IIR digital filter according to the present invention. Preferably, the operation described above relative to the operation of datapath 80 in this regard is implemented by way of a special instruction in the instruction set, microcoded into ROM 78. If this approach is taken, then the quantized sum of products instruction may also readily be used in generating the non-recursive term in the IIR digital filter, and in FIR digital filters if desired. In any event, especially in the case when applied to the recursive loop in an IIR digital filter, the magnitude truncation quantization precludes the manifestation of limit cycles, as noted above.

Figure 11:
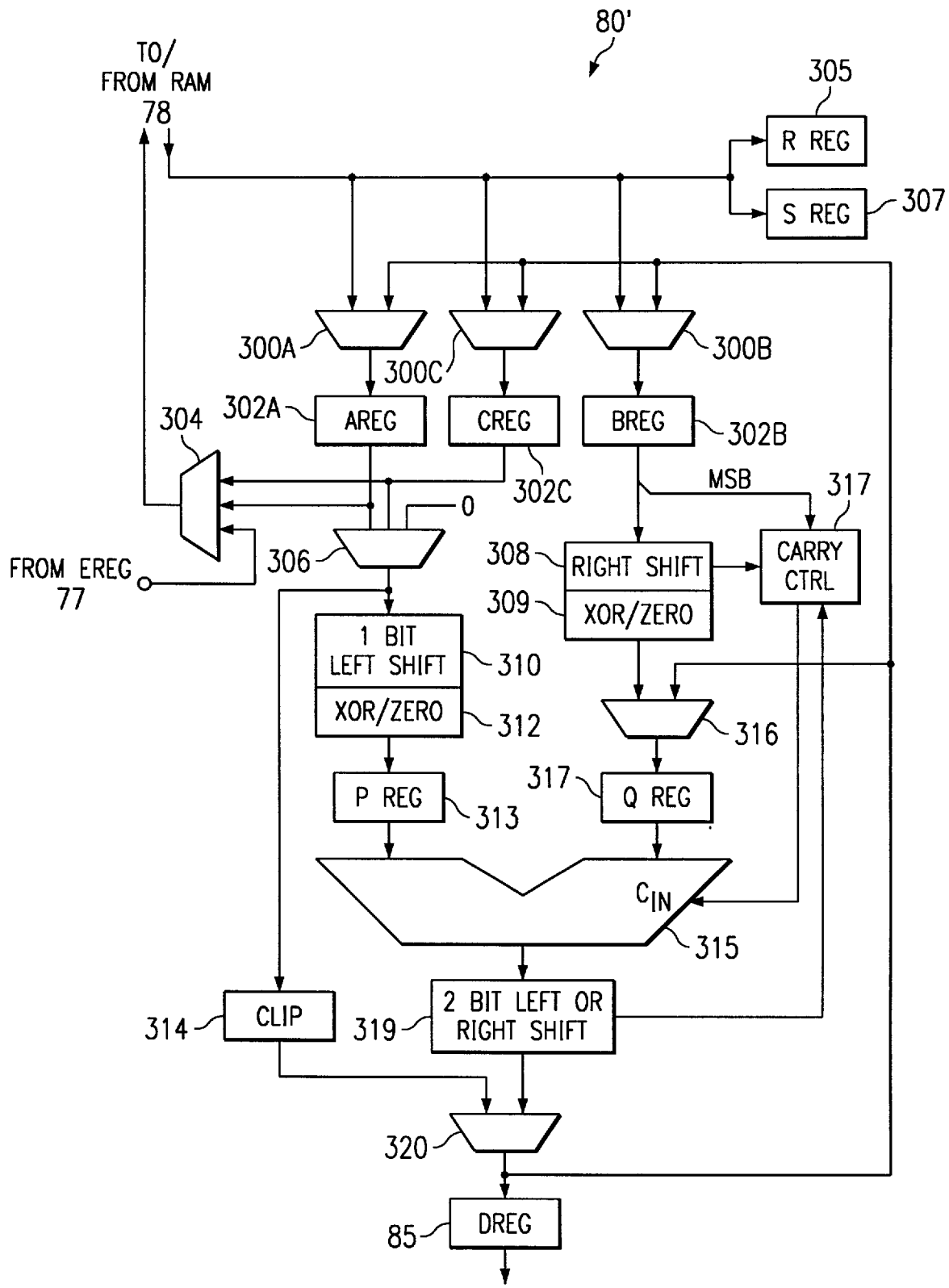
FIG. 11 is an electrical diagram, in block form, of the datapath of the digital signal processor of FIG. 9 constructed to a second alternative implementation according to the second preferred embodiment of the invention.

The above realization of datapath 80 effectively utilizes a single pipeline ALU architecture. According to an alternative realization, datapath 80' of FIG. 11 utilizes a dual pipeline ALU architecture, as will now be described.

Much of the construction of datapath 80' is similar to datapath 80 described hereinabove. Specifically, input sample values are received from EREG 77 and applied, via multiplexer 304, to RAM 76. Data read from RAM 76 are applied to inputs of multiplexers 300A, 300C, 300B, as are data from adder 315. R register 305 and S register 307 store the coefficient values $a_1$, $a_2$, as before. Multiplexers 300A, 300C, 300B have their outputs applied to registers 302A, 302C, 302B, respectively, under the control of DSP controller 82. The outputs of registers 302A, 302C are applied to memory multilpexer 304, and to inputs of multiplexer 306, which has an output forwarded to a series of arithmetic and logic units in one of the dual pipelines in datapath 80'. In this example, this pipeline includes a one-bit left shifter 310, which selectively multiplies its input operand by a factor of 2; XOR/zero function 312 is provided to invert or zero the shifted output of shifter 310. As such, functions 310, 312 operate to effectively perform a three-bit Booth encoded multiply, storing the result in P register 313. Clip circuit 314, in this embodiment, is in a bypass path around functions 310, 312, and is applied to one input of data multiplexer 320.

The output of register 302B, on the other hand, is applied to right shifter 208, which shifts the "B" operand by a selectable number of bits, under the control of DSP controller 82. The least significant bits shifted out from shifter 308 are applied to carry control 317, along with the most significant bit of the B operand from register 302B. Carry control 217 applies a signal to the carry-in input of adder 315 based upon these signals, as described above. The shifted output from shifter 308 is applied to exclusive-OR/zero function 309 and then to Q register 317 via multiplexer 316. A second input of multiplexer 316 receives the feedback result from data multiplexer 320.

P register 315 and Q register 317 are each applied to inputs of adder 315. Adder 315 applies its output to a 2-bit left or right shifter 319, and then to data multiplexer 320, the output of which is both fedback to inputs of multiplexers 300A, 300C, 300B, and also to data register 85. 2-bit left or right shifter 319 has an output applied to carry control 317, by way of which two least significant bits are forwarded to carry control 317 in the event that a right shift is effected. As discussed above, data register 85 buffers the output sample values for communication to external from DSP 75.

The general operation of datapath 80' in producing the partial sums $S_0$ through $S_9$ and final sum $S_{10}$ is equivalent to that described hereinabove relative to datapath 80 of FIG. 10. However, the provision of shifter 319 at the output of adder 315, in combination with P register 313 and Q register 317, enable the use of two paths in datapath 80' to be used in parallel in datapath 80'. Specifically, the feedback directly from the output of data multiplexer 320 to multiplexer 316 provides for immediate feedback of a partial sum for addition with the next product term being generated by shifter 310 and XQR/zero function 312; selected operation of shifter 319 shifts, or does not shift, the previously generated partial sum, depending upon which partial sum is being produced. It is therefore contemplated that datapath 80' is particularly efficient in executing the quantized sum of products used in the recursive (and, if desired, non-recursive) path of digital filters.

Furthermore, each of datapaths 80, 80' utilize adders which are only of the same precision as the signal precision.

Additional precision that is required due to coefficient multiplication is not necessary, because of the present invention. Each of the above embodiments provide the important benefit of eliminating limit cycles from IIR digital filters, while still enabling reduced precision adders to be used in the realization of these filters. It is therefore contemplated that the present invention will be of benefit in many types of applications in which IIR digital filters are utilized.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A method of determining a feedback value in a digital filter, the feedback value corresponding to a sum of first and second products, the first product corresponding to a first coefficient value times a first output sample value, and the second product corresponding to a second coefficient value times a second output sample value, comprising the steps of:

applying a least significant digit of the first coefficient value to the first output sample value to produce a first partial sum in a sequence of partial sums;

adding the first partial sum to a value determined by applying a least significant digit of the second coefficient value to the second output sample value, to produce a next partial sum in the sequence of partial sums;

shifting the next partial sum according to a difference in order between the least significant digit of the second coefficient value and a next digit of the first coefficient value to produce a shifted next partial sum, and a fractional portion comprised of one or more of least significant bits of the next partial sum;

after the shifting step, adding the shifted next partial sum to a value determined by applying the next digit of the first coefficient value to the first output sample value to produce another next partial sum in the sequence of partial sums;

successively performing the adding, shifting, and adding steps according to the first and second coefficient values, to produce a final partial sum in the sequence of partial sums; and generating the feedback value based upon the final partial sum.

2. The method of claim 1, wherein the step of generating the feedback value comprises:

generating a carry signal responsive to the sign of the final partial sum and a logical OR operation of the fractional portions from the shifting step; and adding the final partial sum with the carry signal to produce the feedback value.

3. The method of claim 1, further comprising:

after the step of applying a least significant digit of the first coefficient value to the first output sample value, determining whether the next significant digit of the first coefficient value is of lower order than the least significant digit of the second coefficient value;

responsive to the next significant digit of the first coefficient value being of lower order than the least significant digit of the second coefficient value, then adding the first partial sum to a value determined by applying the next significant digit of the first coefficient value to the first output sample value, to produce a next partial sum;

shifting the next partial sum according to a difference in order between the least significant digit of the first coefficient value and a next digit of the first coefficient value to produce a shifted next partial sum, and a fractional portion comprised of one or more of least significant bits of the next partial sum.

4. The method of claim 1, wherein the first and second coefficient values are in canonic sum digit form.

5. The method of claim 1, wherein the applying steps each comprise:

performing a Booth encoding operation upon a group of bits of a corresponding coefficient value;

controlling a multiply circuit to multiply a corresponding output sample value according to the results of the performing step.

6. The method of claim 1, further comprising:

performing a feed-forward filter operation upon a sequence of input sample values to generate a feed-forward result; and adding the final partial sum to the carry signal and to the feed-forward result, to produce an output sample value.

7. The method of claim 6, further comprising:

applying a high-pass digital filter to the sequence of input sample values, prior to the step of performing a feed-forward filter operation.

8. The method of claim 1, further comprising:

storing the first and second coefficient values in a memory, prior to the step of applying a least significant digit of the first coefficient value to the first output sample value.

9. An electronic system, comprising:

a signal source for generating digital signals; and a digital filter, coupled to the signal source, for filtering the digital signals generated by the signal source, by performing a sequence of operations comprising:

applying a least significant digit of the first coefficient value to the first output sample value to produce a first partial sum in a sequence of partial sums;

adding the first partial sum to a value determined by applying a least significant digit of the second coefficient value to the second output sample value, to produce a next partial sum in the sequence of partial sums;

shifting the next partial sum according to a difference in order between the least significant digit of the second coefficient value and a next digit of the first coefficient value to produce a shifted next partial sum, and a fractional portion comprised of one or more of least significant bits of the next partial sum;

after the shifting step, adding the shifted next partial sum to a value determined by applying the next digit of the first coefficient value to the first output sample value to produce another next partial sum in the sequence of partial sums;

successively performing the adding, shifting, and adding steps according to the first and second coefficient values, to produce a final partial sum in the sequence of partial sums; and generating the feedback value based upon the final partial sum.

10. The system of claim 9, wherein the digital filter comprises:
a programmable logic device.

11. The system of claim 10, wherein the programmable logic device is integrated into an integrated circuit; and further comprising:
memory for storing a sequence of instructions for controlling the operation of the programmable logic device;
memory for storing input sample values corresponding to the digital signals, and for storing output sample values generated by the digital filter; and
an interface coupled to the signal source for receiving the digital signals.

12. The system of claim 9, wherein the digital filter comprises:
a plurality of adders, each having an input for receiving one of a first output sample value and a second output sample value, and having an output for presenting a partial sum; and
a plurality of shifters, each having an input coupled to the output of one of said adders to receive a corresponding partial sum, having a shift output for presenting a shifted partial sum to an input of one of said plurality of adders, and having a fraction output for presenting a fractional portion of the shifted partial sum, each of the plurality of shifters for shifting the partial sum at its input by a number of bit positions corresponding to a difference in order between successive significant digits of first and second coefficient values;
wherein the plurality of adders and the plurality of shifters are arranged in a sequence corresponding to significant digits of the first and second coefficient values from least significant to most significant, with at least one of the plurality of adders receiving the second output sample value disposed between first and second ones of the plurality of adders receiving the first output sample value.

13. The system of claim 12, wherein the digital filter further comprises:
conjunctive logic having inputs coupled to receive fractional portions of shifted partial sums from each of the plurality of shifters, having an input to receive a sign-bit from the output of a last one of the plurality of adders, and having an output for generating a carry signal;
a final adder, having an input coupled to the conjunctive logic to receive the carry signal, and having an input coupled to receive a final partial sum from the last one of the plurality of adders, for generating a final sum; and
a delay stage, coupled to the output of the final adder, for generating the first and second output sample values.

14. The system of claim 13, further comprising:
a feed-forward portion, having an input coupled to receive a sequence of input sample values, and having an output coupled to the final adder.

15. An electronic device, comprising:
a memory for storing instruction codes, input sample values, and output sample values;
a controller, for receiving instruction codes from the memory and for generating control signals based thereupon; and
a datapath, coupled to the controller, for executing a sequence of instructions responsive to the control signals from the controller, the sequence of instructions comprising:
retrieving first and second coefficient values and first and second output sample values from the memory;
applying a least significant digit of the first coefficient value to the first output sample value to produce a first partial sum in a sequence of partial sums;
adding the first partial sum to a value determined by applying a least significant digit of the second coefficient value to the second output sample value, to produce a next partial sum in the sequence of partial sums;
shifting the next partial sum according to a difference in order between the least significant digit of the second coefficient value and a next digit of the first coefficient value to produce a shifted next partial sum, and a fractional portion comprised of one or more of least significant bits of the next partial sum;
after the shifting step, adding the shifted next partial sum to a value determined by applying the next digit of the first coefficient value to the first output sample value to produce another next partial sum in the sequence of partial sums;
successively performing the adding, shifting, and adding steps according to the first and second coefficient values, to produce a final partial sum in the sequence of partial sums; and
generating a feedback value based upon the final partial sum.

16. The electronic device of claim 15, wherein the operation of generating a feedback value comprises:
generating a carry signal responsive to the sign of the final partial sum and a logical OR operation of the fractional portions from the shifting step; and
adding the final partial sum with the carry signal to produce the feedback value.

17. The electronic device of claim 16, wherein the applying operations each comprise:
performing a Booth encoding operation upon a group of bits of a corresponding coefficient value;
controlling a multiply circuit to multiply a corresponding output sample value according to the results of the performing step.

18. The electronic device of claim 16, wherein the datapath comprises:
a Booth encoded multiplier, for multiplying an operand responsive to control signals from the controller;
an inverting circuit, for inverting the multiplied operand responsive to control signals from the controller;
a shifter, for shifting an operand by a selectable number of bit positions, responsive to control signals from the controller;
carry control circuitry, having an input coupled to the shifter, and having another input for receiving a sign-bit of an operand;
an adder, having a first input coupled to the inverting circuit, having a second input coupled to the shifter, and having a carry input coupled to the carry control circuitry; and
a feedback path from the output of the adder to inputs of the Booth encoded multiplier and shifter.

19. The electronic device of claim 16, wherein the datapath comprises:
a first pipeline, comprising:
a left shifter, for multiplying an operand responsive to control signals from the controller;
an inverting circuit, for inverting the multiplied operand responsive to control signals from the controller;

a first result register, coupled to the inverting circuit;
a second pipeline, comprising:
- a right shifter, for shifting an operand by a selectable number of bit positions, responsive to control signals from the controller;
- a second result register, coupled to the right shifter;

carry control circuitry, having an input coupled to the shifter, and having another input for receiving a sign-bit of an operand;

an adder, having a first input coupled to the first result register, having a second input coupled to the second result register, and having a carry input coupled to the carry control circuitry;

a shifter, coupled to the output of the adder; and a feedback path from the output of the shifter to the second pipeline.

* * * * *